(12) United States Patent
Yang et al.

(10) Patent No.: US 11,521,677 B1
(45) Date of Patent: Dec. 6, 2022

(54) MEMORY APPARATUS AND METHOD OF OPERATION USING NEGATIVE KICK CLAMP FOR FAST READ

(71) Applicant: SanDisk Technologies LLC, Addison, TX (US)

(72) Inventors: Xiang Yang, Santa Clara, CA (US); Huai-yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 19 days.

(21) Appl. No.: 17/326,641

(22) Filed: May 21, 2021

(51) Int. Cl.
   *G11C 7/00* (2006.01)
   *G11C 11/56* (2006.01)
   *G11C 16/26* (2006.01)
   *G11C 16/08* (2006.01)
   *G11C 16/04* (2006.01)

(52) U.S. Cl.
   CPC ...... *G11C 11/5642* (2013.01); *G11C 11/5671* (2013.01); *G11C 16/0483* (2013.01); *G11C 16/08* (2013.01); *G11C 16/26* (2013.01)

(58) Field of Classification Search
   CPC .... G11C 8/10; G11C 8/08; G11C 8/12; G11C 8/14; G11C 11/4085
   USPC ........................................ 365/189.15, 185.18
   See application file for complete search history.

(56) References Cited

U.S. PATENT DOCUMENTS

| 7,046,568 | B2 | 5/2006 | Cernea |
| 8,228,728 | B1 * | 7/2012 | Yang .................... G11C 11/5628 365/189.011 |
| 9,786,372 | B2 * | 10/2017 | Nam ...................... G11C 16/08 |
| 10,460,814 | B2 | 10/2019 | Dak et al. |
| 2013/0308389 | A1 | 11/2013 | Yuh |

* cited by examiner

*Primary Examiner* — Son T Dinh
(74) *Attorney, Agent, or Firm* — Dickinson Wright PLLC; Steven C. Hurles

(57) ABSTRACT

A memory apparatus and method of operation are provided. The apparatus includes memory cells connected to word lines and arranged in strings and configured to retain a threshold voltage. A control circuit is coupled to the word lines and strings and is configured to compute a target word line voltage including a kicking voltage to be applied to selected ones of word lines for a kick time during a read operation. The control circuit extends the kick time by a compensation time to a compensated kick time in response to determining the target word line voltage is not greater than a predetermined voltage design limit. The control circuit applies the kicking voltage to the selected ones of word lines for the compensated kick time thereby enabling a word line voltage to reach one of a plurality of reference voltages quickly without exceeding the predetermined voltage design limit.

20 Claims, 16 Drawing Sheets

FIG. 7A

| TABLE 1 | Er | A | B | C | D | E | F | G |
|---|---|---|---|---|---|---|---|---|
| LP | 1 | 0 | 0 | 0 | 0 | 1 | 1 | 1 |
| MP | 1 | 1 | 1 | 0 | 1 | 1 | 0 | 0 |
| UP | 1 | 1 | 0 | 0 | 0 | 0 | 0 | 1 |

FIG. 7B

STATE OF CELLS DURING DIFFERENT READS IN 2-3-2 READ

| READ PAGE | READ LEVEL | Er | A | B | C | D | E | F | G | REDUCTION OF ADDITIONAL MEMORY STATES |
|---|---|---|---|---|---|---|---|---|---|---|
| LP | AR | C | NC | NC | NC | NC | NC | NC | NC | - |
|  | ER | IC | C | C | C | C | NC | NC | NC | - |
| MP | BR | EIC | C | NC | C | NC | NC | NC | NC | 1/2 |
|  | DR | IC | IC | C | C | NC | NC | NC | NC | - |
|  | FR | IC | IC | IC | IC | EIC | C | NC | NC | 1/2 |
| UP | CR | EIC | EIC | C | NC | EIC | NC | NC | NC | 2/3 |
|  | GR | IC | IC | EIC | EIC | EIC | EIC | C | NC | 3/4 |

| PAGE | NORMAL READ | REVERSE READ |
|---|---|---|
| LP | A→E | E→A |
| MP | B→D→F | F→D→B |
| UP | C→G | G→C |

*FIG. 10*

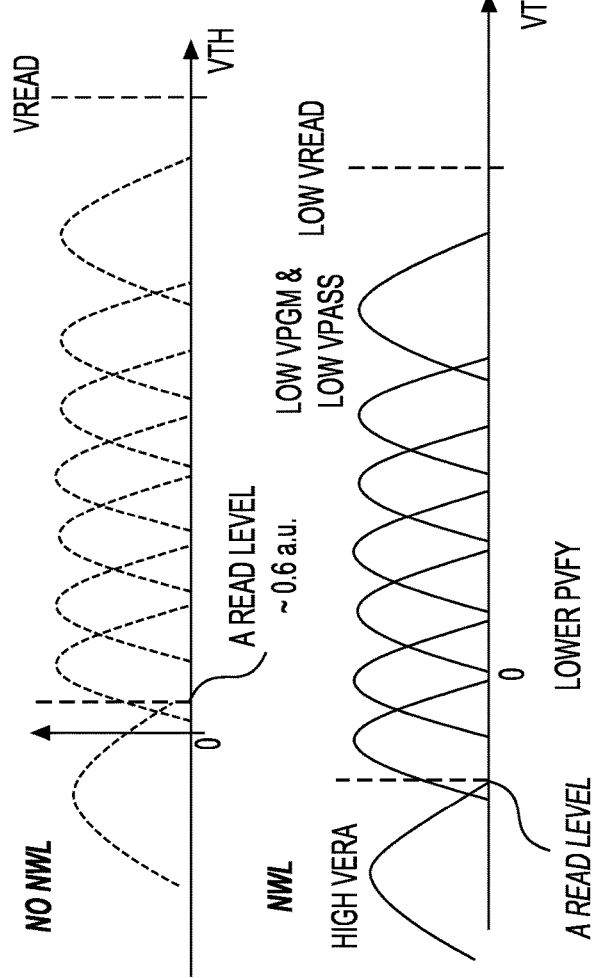
FIG. 11A
FIG. 11B
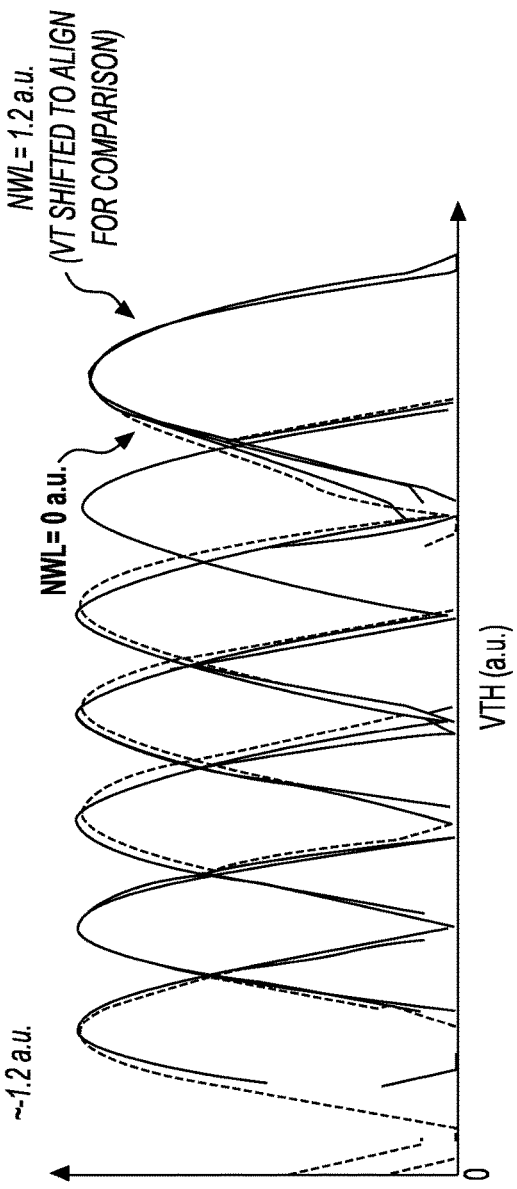
FIG. 12

| CALCULATED TARGET VOLTAGE (AR-Δ$_{KICK2}$) | COMPENSATION ΔT$_{KICK}$ |
|---|---|
| >=-2.4 a.u. | DT1 |
| -2.5 a.u. = AR-Δ$_{KICK2}$<-2.4 a.u. | DT2 |
| -2.6 a.u. = AR-Δ$_{KICK2}$<-2.5 a.u. | DT3 |
| -2.7 a.u. = AR-Δ$_{KICK2}$<-2.6 a.u. | DT4 |
| -2.8 a.u. = AR-Δ$_{KICK2}$<-2.7 a.u. | DT5 |
| -2.9 a.u. = AR-Δ$_{KICK2}$<-2.8 a.u. | DT6 |
| -3.0 a.u. = AR-Δ$_{KICK2}$<-2.9 a.u. | DT7 |

*FIG. 16*

MEMORY APPARATUS AND METHOD OF OPERATION USING NEGATIVE KICK CLAMP FOR FAST READ

FIELD

This application relates to non-volatile memory apparatuses and the operation of non-volatile memory apparatuses.

BACKGROUND

This section provides background information related to the technology associated with the present disclosure and, as such, is not necessarily prior art.

In order to improve read and program performance of memory devices, multiple charge storage elements or memory transistors in an array are read or programmed in parallel. Thus, a "page" of memory elements are typically read or programmed together. Both reading and verifying operations are performed by executing one or more sensing cycles in which the conduction current or threshold voltage of each memory cell of the page is determined relative to a demarcation value. In general, if the memory is partitioned into n states, there will be at least n−1 sensing passes or levels to resolve all possible memory states. In many implementations, each sensing cycle may also involve two or more passes or levels.

During read operations, for example, memory devices may employ "kicking voltages" to cause word line voltages to quickly settle to a target voltage necessary for sensing. Yet, some memory devices may have a limit to the voltages that may be provided to the word lines by associated control circuitry. Insufficient kicking voltages can cause increased word line settling time leading to longer read times and/or increased failure bit counts. Therefore, there is a need for improved non-volatile memory apparatuses.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide an apparatus including memory cells connected to one of a plurality of word lines and arranged in strings and configured to retain a threshold voltage corresponding to one of a plurality of memory states. The memory apparatus also includes a control circuit coupled to the plurality of word lines and the strings and configured to compute a target word line voltage including a kicking voltage to be applied to selected ones of the plurality of word lines for a kick time during a read operation. The control circuit is also configured to extend the kick time by a compensation time to a compensated kick time in response to determining the target word line voltage is not greater than a predetermined voltage design limit. The control circuit applies the kicking voltage to the selected ones of the plurality of word lines for the compensated kick time thereby enabling a word line voltage of the selected ones of the plurality of word lines to reach one of a plurality of reference voltages quickly without exceeding the predetermined voltage design limit.

According to another aspect of the disclosure, a controller in communication with a memory apparatus including memory cells connected to one of a plurality of word lines and arranged in strings and configured to retain a threshold voltage corresponding to one of a plurality of memory states is also provided. The controller is configured to compute a target word line voltage including a kicking voltage to be applied to selected ones of the plurality of word lines for a kick time during a read operation. The controller is also configured to instruct the memory apparatus to extend the kick time by a compensation time to a compensated kick time in response to determining the target word line voltage is not greater than a predetermined voltage design limit. In addition, the controller is configured to instruct the memory apparatus to apply the kicking voltage to the selected ones of the plurality of word lines for the compensated kick time thereby enabling a word line voltage of the selected ones of the plurality of word lines to reach one of a plurality of reference voltages quickly without exceeding the predetermined voltage design limit.

According to an additional aspect of the disclosure a method of operating a memory apparatus is provided. The memory apparatus includes memory cells connected to one of a plurality of word lines and arranged in strings and configured to retain a threshold voltage corresponding to one of a plurality of memory states. The method includes the step of computing a target word line voltage including a kicking voltage to be applied to selected ones of the plurality of word lines for a kick time during a read operation. The method continues with the step of extending the kick time by a compensation time to a compensated kick time in response to determining the target word line voltage is not greater than a predetermined voltage design limit. The method proceeds by applying the kicking voltage to the selected ones of the plurality of word lines for the compensated kick time thereby enabling a word line voltage of the selected ones of the plurality of word lines to reach one of a plurality of reference voltages quickly without exceeding the predetermined voltage design limit.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 7A is a schematic read level chart illustrating one embodiment of a read operation utilizing the method of FIG. 6 according to aspects of the disclosure;

FIG. 7B is a chart illustrating one embodiment of locking out or inhibiting conducting cells during a read level during a read operation following a read scheme of read level chart of FIG. 7A according to aspects of the disclosure;

FIG. 10 is a table illustrating sequences or series of the data states being sensed for each of a lower page, middle page, and upper page for both the normal read and the reverse read according to aspects of the disclosure;

FIGS. 11A-11B show threshold voltage windows using negative word lines and not using negative word lines according to aspects of the disclosure;

FIG. 12 shows a plot of threshold voltages of a plurality of memory cells with and without negative word line voltages according to aspects of the disclosure;

FIG. 16 is an exemplary compensation time look up table according to aspects of the disclosure;

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
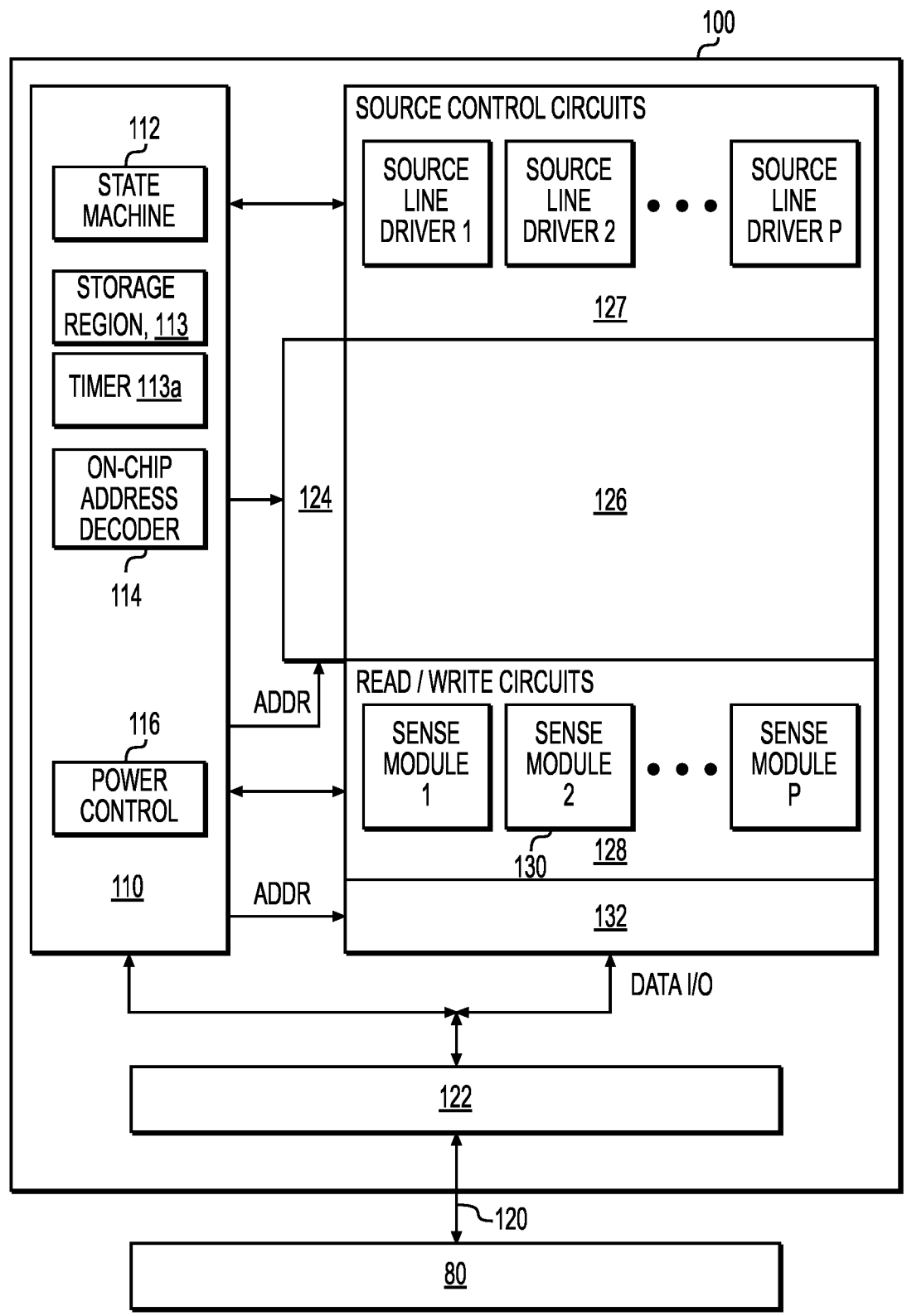
FIG. 1 is a schematic diagram illustrating one embodiment of a memory device according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge trapping layer.

During a program operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming pulses until the programming is completed. Next, a second word line, WL1, is programmed using one or more programming pulses until the programming is completed, and so forth. A programming pulse may include a set of increasing program voltages which are applied to the word line in respective program loops or program-verify iterations. Verify operations or stages may be performed after each program voltage to determine whether the memory cells have completed programming. When programming is completed for a memory cell, it can be inhibited from further programming while programming continues for other memory cells in subsequent program loops.

Each memory cell may be associated with a data state according to write data in a program command. Based on its data state, a memory cell will either remain in the erased state or be programmed to a programmed data state. For example, in a three bit per cell memory device, there are eight data states including the erased state and the programmed state (see e.g., FIG. 4).

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the threshold voltage Vt or Vth of the memory cell exceeds the read voltage. The read voltages are set at levels which are expected to be between the threshold voltage levels of adjacent data states.

The order of the sequence or series of read voltages applied to the word lines while sensing may include a series of read voltages of a normal read; however, a different or adjusted series of read voltages of a reverse read may be utilized instead to improve the speed of the read operation. In more detail, the read voltages for different data states vary in magnitude, with higher magnitude read voltages associated with sensing data states corresponding to higher threshold voltages and lower magnitude read voltages associated with sensing data states corresponding to sensing lower threshold voltages. In the normal read, the series of read voltages become increasing higher in magnitude with each successive data state that is being sensed. And in the reverse read, the adjusted series of read voltages become increasing lower in magnitude with each successive data state that is being sensed. Because the series of read voltages typically begins with an initial voltage spike and then transitions to a first one of the series of read voltages, the speed of the read operation can be improved by applying the higher magnitude read voltage first, as in the reverse read, so that the voltage transition from the initial voltage spike is reduced.

Furthermore, to cause a word line to quickly settle to a target voltage during a read operation, a "kicking voltage" (i.e., an overshoot or undershoot of the voltage) may be applied to the selected word line between each of the series of read voltages for successive data states being sensed. Depending on the read reference voltages used for each state, the encoding of bits for each state, and the magnitude of any negative kicking voltages, the control circuitry of the memory apparatus may need to apply negative voltages of significant magnitude. However, there may be a limit to the negative voltages that may be applied to the word lines by such control circuitry and result in concerns with word line settling time and performance of the read operation.

FIG. 1 is a schematic diagram illustrating one embodiment of a memory device 100. Memory device 100 includes a memory array 126 of memory cells, such as a two-dimensional array of memory cells or a three-dimensional array of memory cells. The memory array 126 may include memory cells according to an NAND flash type or NOR flash type architecture. Memory cells in a NAND configuration are accessed as a group and are typically connected in series. A NAND memory array is composed of multiple strings in which each string is composed of multiple memory cells sharing a bit line and accessed as a group. Memory cells in a NOR configuration may be accessed individually. NAND flash and NOR flash memory cells may be configured for long-term storage of information as non-volatile memory retaining information after power on/off cycles. Memory array 126 may also be other types of memory cells programmable to store multiple bits of data per cell as non-volatile memory or volatile memory and may be other types of memory cells in other configurations besides NAND or NOR configurations. Memory device 100 may include multiple dies of memory arrays 126.

Memory array 126 is addressable by word lines via a row decoder 124 and by bit lines via a column decoder 132. Row decoder 124 selects one or more word lines and the column decoder 132 selects one or more bit lines in order to apply appropriate voltages to the respective gates/drains of the addressed memory transistor.

Read/write circuits 128 are provided to read or write (program) the memory states of addressed memory transistors. Read/write circuits 128 include multiple sense modules 130 (sensing circuitry) that allow a page (or other unit) of memory cells to be read or sensed in parallel. Each sense module 130 includes bit line drivers and circuits for sensing.

Control circuitry 110 cooperates with read/write circuits 128 to perform memory operations on memory array 126. Control circuitry 110 may include a state machine 112, an on-chip address decoder 114, and a power control module 116. State machine 112 provides chip-level control of memory operations. A storage region 113 may be provided, e.g., for compensation times $\Delta T_{kick}$ used to extend a kick time of a kicking voltage applied to word lines during a read operation, as described further below. Generally, the storage region may store operational parameters and software/code. A timer 113*a* may also be used to extend timing of the kick time of the kicking voltage, described in more detail below, for example. On-chip address decoder 114 provides an address interface between a host or a memory controller to the hardware address used by decoders 124 and 132. Power control module 116 controls the power and voltages supplied to the word lines and bit lines during memory operations. Control circuitry 110 may include drivers for word lines, source side select lines (SGS), drain side select lines (SGD), and source lines. Control circuitry 110 is also in communication with source control circuits 127, which includes source line driver circuits used to drive varies voltages on the individual source lines.

Memory device 100 includes a controller 122 which operates with a host 80 through a link 120. Commands and data are transferred between a host and controller 122 via a link 120. Link 120 may be via a connection (e.g., a communication path), such as a bus or a wireless connection.

Memory device 100 may be used as storage memory, a main memory, a cache memory, a backup memory, or a redundant memory. Memory device 100 may be an internal storage drive, such as a notebook hard drive or a desktop hard drive. Memory device 100 may be a removable mass storage device, such as, but not limited to, a handheld, removable memory device, such as a memory card (e.g., a secure digital (SD) card, a micro secure digital (micro-SD) card, or a multimedia card (MMC)) or a universal serial bus (USB) device. Memory device 100 may take the form of an embedded mass storage device, such as an eSD/eMMC embedded flash drive, embedded in host 80. Memory device 100 may also be any other type of internal storage device, removable storage device, embedded storage device, external storage device, or network storage device.

Memory device 100 may be directly coupled to host 80 or may be indirectly coupled to host 80 via a network. For example, the network may include a data center storage system network, an enterprise storage system network, a storage area network, a cloud storage network, a local area network (LAN), a wide area network (WAN), the Internet, and/or another network.

Instructions may be executed by various components of memory device 100, such as by controller 100, controller circuitry 110, row decoder 124, column decoder 132, read/write circuits 128, source control circuits 127, logic gates, switches, latches, application specific integrated circuits (ASICs), programmable logic controllers, embedded microcontrollers, and other components of memory device 100.

Figure 2:
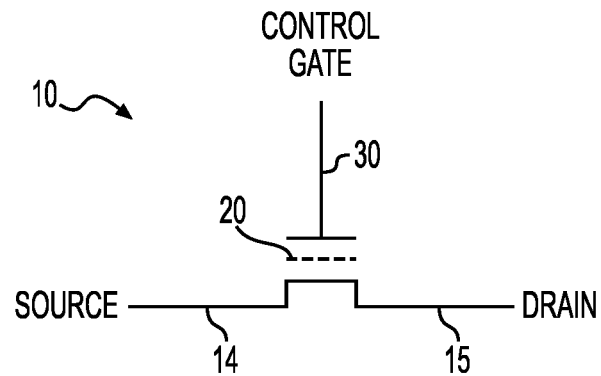
FIG. 2 is a schematic diagram illustrating one embodiment of a flash non-volatile memory cell according to aspects of the disclosure.

FIG. 2 is a schematic diagram illustrating one embodiment of a flash non-volatile memory cell 10. Memory cell 10 can be implemented by a field-effect transistor having a charge storage unit 20, such as a floating gate or a dielectric layer. Memory cell 10 also includes a source 14, a drain 16, and a control gate 30. A memory state of memory cell 10 may be read by sensing the conduction current across the source and drain electrodes of the cell when a reference voltage is applied to the control gate 30. For each given charge on the floating gate of a cell, a corresponding conduction current with respect to a fixed reference control gate voltage may be detected. A range of charge programmable onto the floating gate defines a corresponding threshold voltage window or a corresponding conduction current window of the memory states of memory cell 10.

Figure 3:
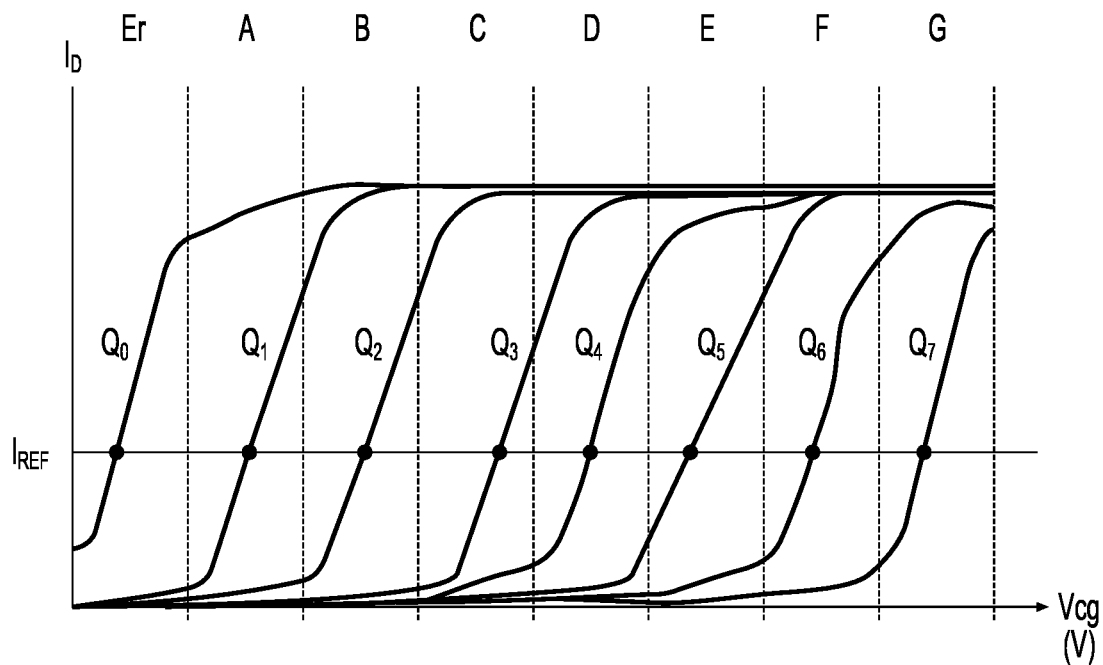
FIG. 3 is a schematic diagram illustrating one embodiment of the relation between a source-drain current and a control gate voltage for eight different charge levels that the floating gate of a memory cell may be selectively storing at any one time according to aspects of the disclosure.

FIG. 3 is a schematic diagram illustrating one embodiment of the relation between a source-drain current ID and a control gate voltage $V_{CG}$ for eight different charge levels Q0-Q7 that the floating gate of a memory cell, such as memory cell 10 of FIG. 2, may be selectively storing at any one time. The eight curves represent eight charge levels on a floating gate of a memory cell corresponding to eight possible memory states. Eight possible memory states representing one erased memory state ER and seven programmed states A, B, C, D, E, F, and G may be demarcated by partitioning the threshold window into eight regions. For example, if a reference current $I_{REF}$ is used, then a cell programmed with a charge level Q1 may be considered to be in an A memory state since its curve intersects with $I_{REF}$ in the region of the A threshold voltage window. If a reference current $I_{REF}$ is used, then a cell programmed with a charge level Q3 may be considered to be in a C memory state since its curve intersects with $I_{REF}$ in the region of the C threshold voltage window.

Figure 4:
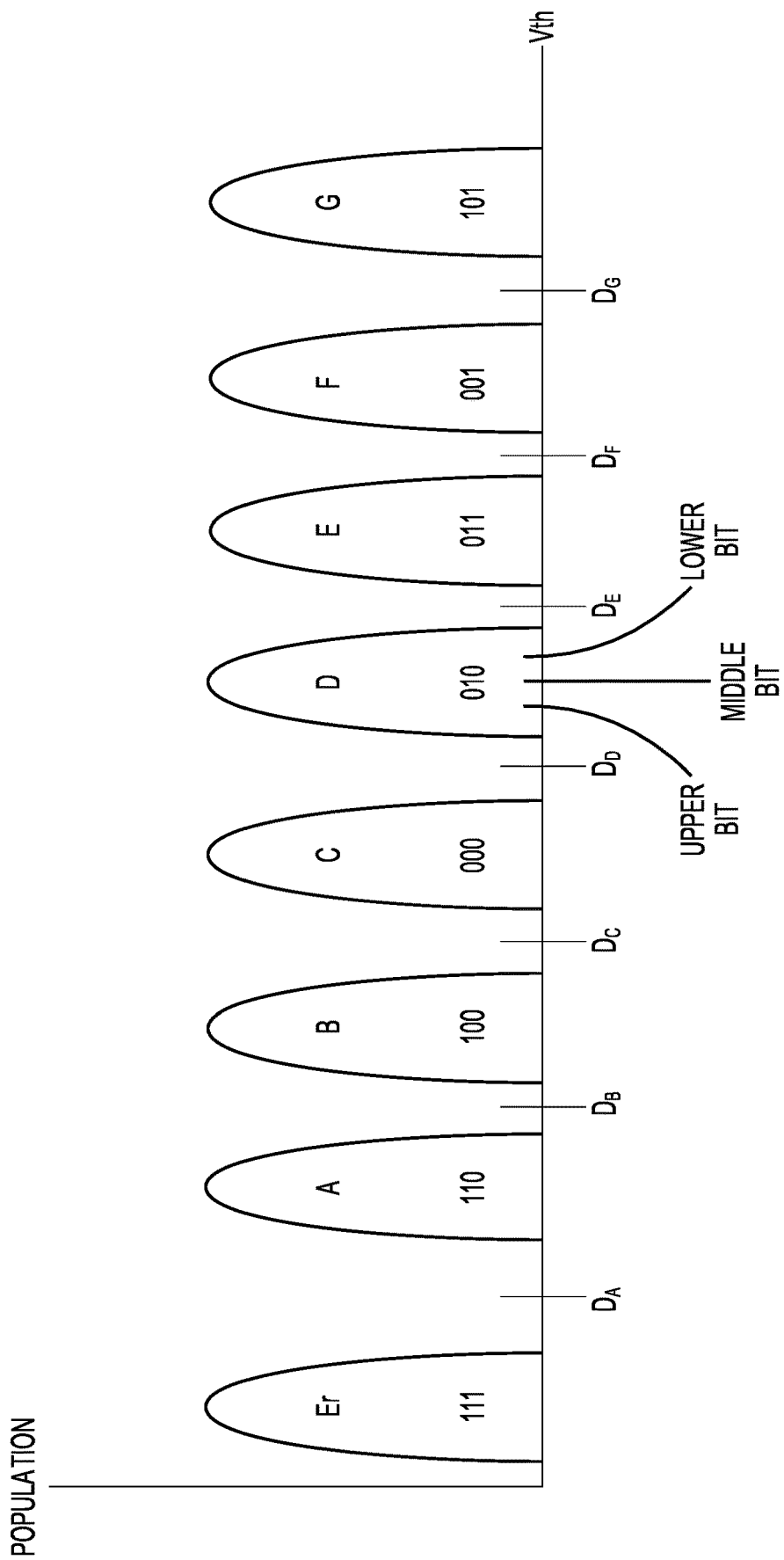
FIG. 4 is a schematic diagram illustrating one embodiment of threshold voltage distributions of a memory array with memory cells operable in eight memory states according to aspects of the disclosure.

FIG. 4 is a schematic diagram illustrating one embodiment of threshold voltage distributions of a memory array with memory cells operable in eight memory states. The possible threshold voltages of each memory cell spans a threshold window which is partitioned into eight regions to demarcate eight possible memory states, "Er", "A", "B", "C", "D", "E", "F" and "G". "Er" is an erased state or a ground state and "A" through "G" are seven progressively programmed states. During a read operation, the eight states may be demarcated by seven demarcation breakpoints of demarcation threshold voltages, $D_A$, $D_B$, $D_C$, $D_D$, $D_E$, $D_F$, and $D_G$.

FIG. 4 also shows one embodiment of 3-bit gray coding represented by the eight possible memory states. Each of the eight memory states represented a triplet of upper, middle, and lower bits. In this embodiment, erased memory state represents "111", A memory state represents "110", B memory state represents "100", C memory state represents "000", D memory state represents "010", E memory state represents "011", F memory state represents "001", and G memory state represents "101." The 3 code bits, "lower", "middle" and "upper" bits, may be read or programmed separately. For example, in a first round, the lower bits of the memory cells may be read. In a second round, the middle bits of the memory cells may be read. In a third round, the upper bits of the memory cells may be read. Similarly in programming, in a first round the lower bits of the memory cells may be programmed and verified. In a second round the middle bits of the memory cells may be programmed and verified. In a third round the upper bits of the memory cells may be programmed and verified.

FIGS. 3 and 4 show a memory cell having eight memory states and operating as a triple-level cell (TLC) or X3 cell storing 3 bits/cell. In other embodiments, a memory cell may have more than eight memory states. For example, a memory cell may have sixteen memory states operating as a quadruple-level memory cell (QLC) or X4 cell storing 4 bits/cell.

Figure 5:
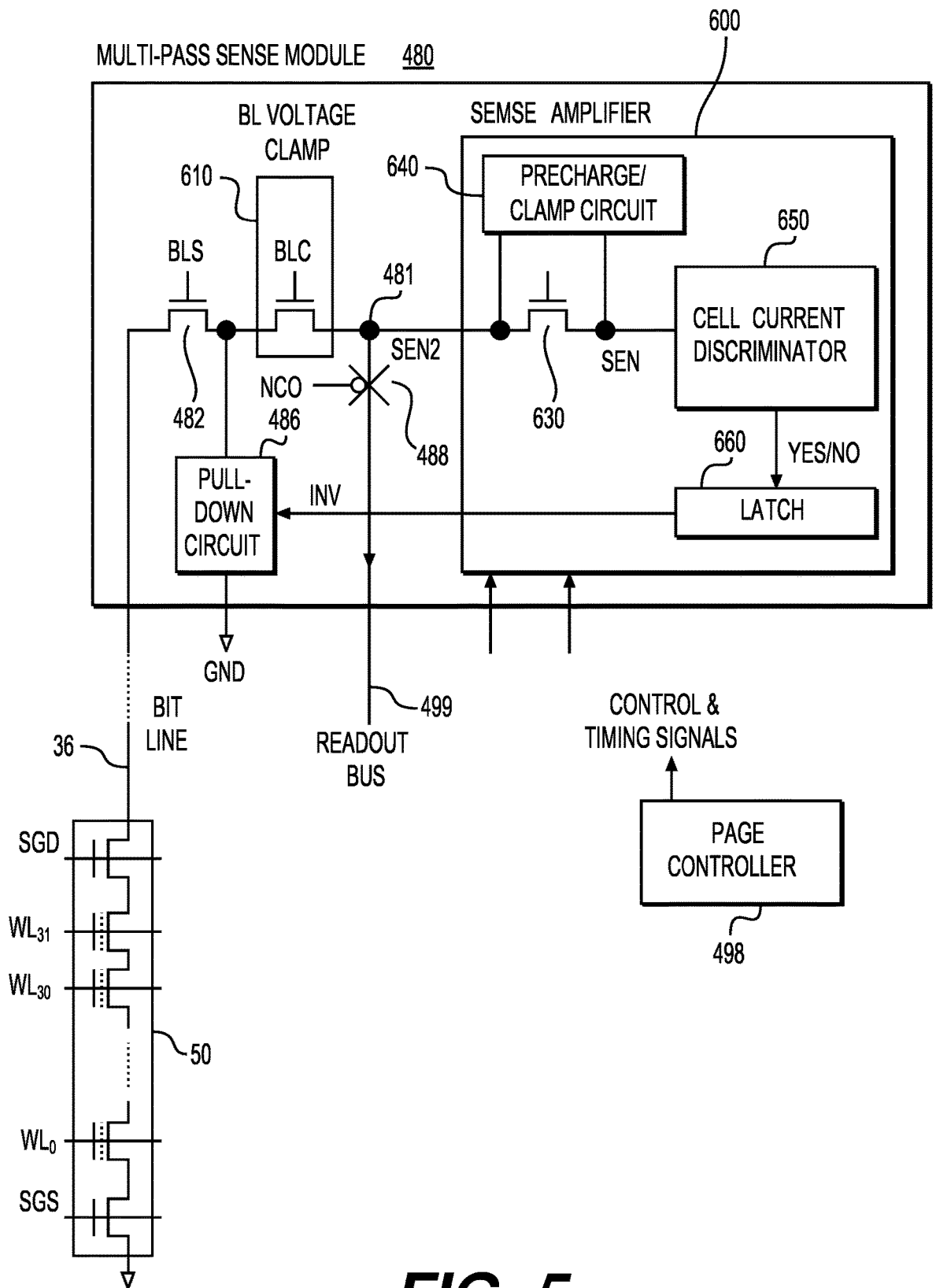
FIG. 5 is a schematic diagram illustrating one embodiment of a sense block for sensing a conduction current of a memory cell for read operations or verify operations according to aspects of the disclosure.

FIG. 5 illustrates schematically in more details a preferred sense module shown as sense module 130 in FIG. 1. The sense module 480 senses the conduction current of a memory cell in a NAND chain 50 via a coupled bit line 36. It has a sense node 481 that can be selectively coupled to a bit line, a sense amplifier 600 or a readout bus 499. Initially, an isolation transistor 482, when enabled by a signal BLS connects the bit line 36 via a bit line voltage clamp 610 (controlled by a signal BLC) to the sense node 481. The sense amplifier 600 senses a signal SEN2 at the sense node 481. The sense amplifier includes a precharge/clamp circuit 640, a cell current discriminator 650 and a latch 660. In this example, the NAND chain 50 has thirty-two memory cells in series with their control gates connected to word lines $WL_0$-$WL_{31}$ respectively. The NAND chain 50 is coupled to ground via a select transistor controlled by a signal SGS and coupled to the bit line 36 via a select transistor controlled by a signal SGD.

The sense module 480 enables the conduction current of the selected memory cell in the NAND chain to be sensed. Prior to sensing, the voltages to the gates of the selected memory cell must be set via the appropriate word lines and bit line. As will be described in more detail later, the precharge operation starts with the unselected word line charging to a voltage Vread followed by charging the selected world line to a predetermined threshold voltage Vt(i) for a given memory state under consideration. Then the precharged circuit 640 brings the bit line voltage to a predetermined drain voltage appropriate for sensing. This will induce a source-drain conduction current to flow in the selected memory cell in the NAND chain 50, which is detected from the channel of the NAND chain via a coupled bit line 36. The conduction current is a function of the charge programmed into the memory cell and the applied Vt(i) when there exists a nominal voltage difference between the source and drain of the memory cell.

When the Vt(i) voltage is stable, the conduction current or the programmed threshold voltage of the selected memory cell can be sensed via the coupled bit line 36. The sense amplifier 600 is then coupled to the sense node to sense the conduction current in the memory cell. The cell current discriminator 650 serves as a discriminator or comparator of current levels. It effectively determines whether the conduction current is higher or lower than a given demarcation current value $I_0(j)$. If it is higher, the latch 660 is set to a predetermined state with the signal INV=1.

A pull-down circuit 486 is activated in response to the latch 660 setting the signal INV to HIGH. This will pull down the sense node 481 and therefore the connected bit line 36 to ground voltage. This will inhibit the conduction current flow in the memory cell 10 (i.e., lock out) irrespective of the control gate voltage since there will be no voltage difference between its source and drain.

According to an aspect, there can be a page of memory cells being operated on by a corresponding number of multi-pass sense modules 480. A page controller 498 supplies control and timing signals to each of the sense modules. The page controller 498 cycles each of the multi-pass sense module 480 through a predetermined number of passes (j=1 to N) and also supplies a predetermined demarcation current value $I_0(j)$ for each pass. As is well known in the arts, the demarcation current value can also be implemented as a demarcation threshold voltage, or time period for sensing. After the last pass, the page controller 498 enables a transfer gate 488 with a signal NCO to read the state of the sense node 481 as sensed data to a readout bus 499. In all, a page of sense data will be read out from all the multi-pass modules 480. Similar sense modules have been disclosed in U.S. Pat. No. 7,046,568 granted May 16, 2006 to Cernea et al., entitled "MEMORY SENSING CIRCUIT AND METHOD FOR LOW VOLTAGE OPERATION". The entire disclosure of U.S. Pat. No. 7,046,568 is herein incorporated by reference.

Figure 6:
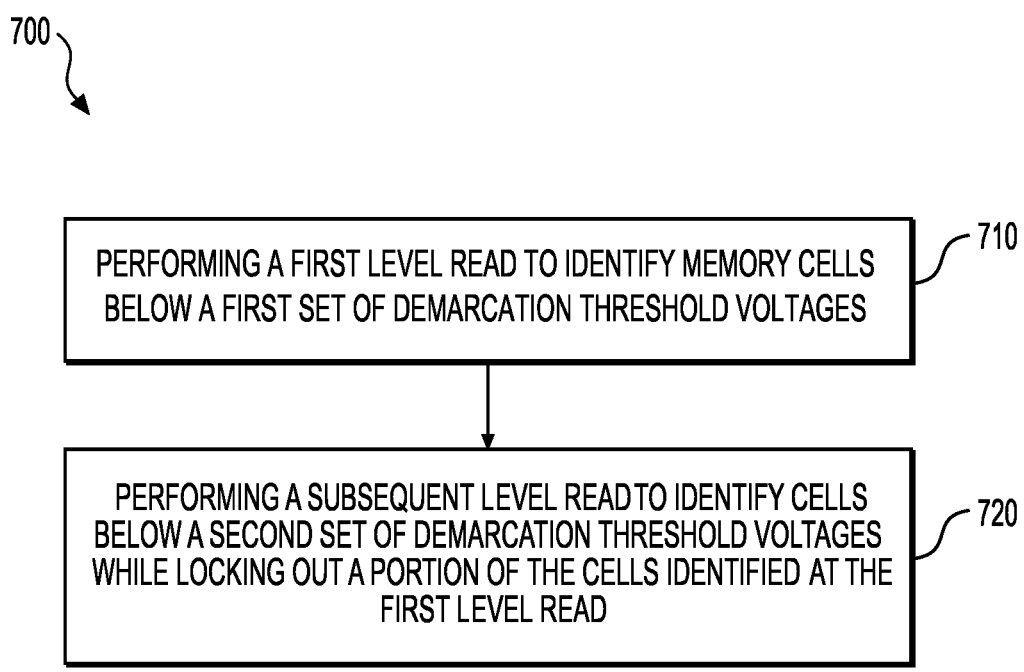
FIG. 6 is a flowchart illustrating one embodiment of a method of sensing the memory states of a memory device according to aspects of the disclosure.

FIG. 6 is a flowchart illustrating one embodiment of a method 700 of sensing a memory state of the memory cells of a memory device, such as memory device 100 of FIG. 1 and sense module 130, 480 of FIG. 1 and FIG. 5, but other memory devices and sense modules are possible.

In process 710, a first page read may be performed. The first page read includes one or more read levels of a first series of one or more demarcation threshold voltages. The first page read identifies memory cells with threshold voltages below the first series of one or more demarcation threshold voltages.

In process 720, a subsequent page read may be performed. The subsequent page read includes one or more read levels of a second series of one or more demarcation threshold voltages. The subsequent page read identifies memory cells with threshold voltages below the second series of one or more demarcation threshold voltages. During the subsequent page read, a portion of the memory cells identified at process 710 are locked out during one or more of the read levels in the subsequent page read. During the subsequent page read, a portion of the memory cells identified in a prior read level in the current page read may also be locked out during subsequent read levels in the current page read.

Peak channel current ($I_{CC}$) is an important metric for the memory device or apparatus and is defined as the highest $I_{CC}$ level during the given operation. Thus, peak $I_{CC}$ is significant to the power management of the memory device or apparatus. Method 700 may be used to reduce $I_{CC}$ or current consumed by memory array 126 or memory die during read operations. In read operations of more than one page read, memory cells identified in a first page read may be locked out in a subsequent page read to conserve current consumed. Prior page read information alone or in combination with prior read level information in a current page read may be used to lockout additional number of memory cells during a current page read to reduce $I_{CC}$ during a read operation.

FIG. 7A is a read level chart 800 illustrating one embodiment of a read operation utilizing the method 700 of FIG. 6. Read level chart 800 illustrates a read operation discerning the lower bits, middle bits, and upper bits of the 8-state memory encoded with a Gray code of FIG. 4 using a 2-3-2 read scheme. The read scheme includes three pages of reads of a lower page read, a middle page read, and an upper page read. In the lower page read, two demarcation threshold voltages are provided to identify memory cells with two read levels to discern the lower bits. In the middle page read, three demarcation threshold voltages are provides to identify memory cells with three read levels to discern the middle bits. In the upper page read, two demarcation threshold voltages are provides to identify memory cells with two read levels to discern the upper bits. In the read scheme, certain memory cells in certain memory states are locked out during a read level so that power is not drained unnecessarily. Memory cells may be locked out by inhibiting the conductive cells or by having their conduction currents turned off by grounding their bit lines (or connect to SGS transistor source node value if NAND string source is set to non-zero).

FIG. 7B is a table 850 illustrating one embodiment of locking out or inhibiting conducting cells during a read level to reduce $I_{CC}$ during a read operation following a read scheme of read level chart 800 of FIG. 7A. The entry "c" represents non-inhibited conductive cells during a particular read level. The entry "nc" represents non-conductive cells during a particular read level. The entry "ic" represents inhibited conductive cells during a particular read level. These cells are identified based on a prior read level from the same page this is being read. The entry "eic" represents extra or additional inhibited conductive cells during a particular read level in which the extra or additional inhibited conductive cells are identified from a prior read level from a prior page read.

A lower page read comprising a two level read with a first level A read relative to demarcation of $D_A$ and a second level E read relative to demarcation threshold voltage $D_E$, may discern the lower bits of the memory cells. In the first level A read, those memory cells with programmed threshold voltages less than the demarcation threshold voltage $D_A$ are detected. In the second level E read, those memory cells with programmed threshold voltages less than the demarcation threshold voltage $D_E$ are detected. In the second level E read, Erased state memory cells previously identified under A read from the current lower page read may be locked out during E read.

A middle page read comprising a three level read with a first level B read relative to demarcation threshold voltage of $D_B$, a second level D read relative to demarcation threshold voltage $D_D$, and a third level F read relative to demarcation threshold $D_F$ may discern the middle bits of the memory cells. In the first level B read, those memory cells with programmed threshold voltages less than the demarcation threshold voltage $D_B$ are detected. In the first level B read, Erased state memory cells previously identified under A read in the prior lower page read are locked out. In the second level D read, those memory cells with programmed threshold voltages less than the demarcation threshold voltage Do are detected. In the second level D read, Erased and A state memory cells previously identified under B read in the current middle page may be locked our during D read. In the third level F read, those memory cells with programmed threshold voltages less than the demarcation threshold voltage $D_F$ are detected. In the third level F read, Erased, A, B, C, and D state memory cells previously identified under E read from the prior lower page read may be locked out during F read.

An upper page read comprising a two level read with a first level C read relative to demarcation of $D_C$ and a second level G read relative to demarcation threshold voltage $D_G$ may discern the upper bits. In the first level C read, those memory cells with programmed threshold voltages less than the demarcation threshold voltage D, are detected. In the first level C read, Erased and A state memory cells previously identified under B read from the prior middle page read may be locked out during C read. In the second level G read, those memory cells with programmed threshold voltages less than the demarcation threshold voltage $D_G$ are detected. In the second level G read, Erased, A, B, C, D, and E previously detected under F read from prior middle page read may be locked out.

Locking out additional memory cells identified in a prior read level from a prior page read as compared to only locking out memory cells identified in a prior level from a current page read reduces the number of cells sensed and reduces the $I_{CC}$ or power consumed. Column 860 of table 850 indicates the fraction or percentage of additional memory states locked out using prior read level from a prior page read relative to the remaining conductive memory states identified simply by using a prior read level from a current page read. The additional memory states locked out are identified from a prior read level for a prior page read which could not have been identified from a prior level in a current page read.

For example, in B read in a middle page read, additional Erased state conductive memory cells may be locked out. The additional Erased state memory cells are identified from the prior lower page A read. No additional memory cells could have been identified in the current middle page read without a prior read level or a without a prior dummy read in the current middle page read. In B read, the sense operation is sensing two memory states of conducting Erased and A state memory cells if memory state information is only used from the current middle page read. In B read, the sense operation is sensing one memory state of conducting A state memory cells if Erased state memory cells identified in the prior lower page A read are locked out. Therefore, utilizing memory state information in a prior lower page A read in comparison to a current middle page read results in locking out one additional memory state out of two conducting memory states sensed in the B read.

For example, in F read in a middle page read, additional D state conductive memory cells may be locked out as well as locking out Erased, A, B, and C state conducting memory cells. The additional D state memory cells as well as Erased, A, B, and C state conducting memory cells may be identified from the lower page read E. Erased, A, B, and C state conducting memory cells could have also been identified in the prior level D read of the current middle page read. In F read, the sense operation is sensing two memory states of the conducting D and E state memory cells if only memory cells identified in the prior D level read of the current page read are locked out. In F read, the sense operation is sensing one conducting memory cell state in an E memory state if D state memory cells identified in the prior lower page E read are locked out. Therefore, utilizing memory state information in a prior lower E page read in comparison to a prior D read level in a current middle page read results in locking out one additional memory state out of two conducting memory states sensed in the F read.

For example, in C read in an upper page read, additional Erased and A state conductive memory cells may be locked out. The additional Erased and A state memory cells are identified from the middle page B read. No additional memory cells could have been identified in the current upper page read without a prior read level or without a dummy read in the current upper page read. In C read, the sense operation is sensing three memory states of the conducting Erased, A, and B state memory cells if memory state information is only used from the current upper page read. In C read, the sense operation is sensing one memory state of conducting B state memory cells if Erased and A state memory cells identified in the prior middle page B read level are locked out. Therefore, utilizing information in a prior middle page B read level in comparison to a current upper page read results in locking out two additional memory states out of the three conductive memory states sensed in the C read.

For example, in G read in a upper page read, additional C, D, and E state conductive memory cells may be locked out as well as locking out Erased, A, and B state conducting memory cells. The additional C, D, and E state memory cells as well as Erased, A, and B state conducting memory cells may be identified from the middle page F read. Erased, A, and B state conducting memory cells could have also been identified in the prior level of the current upper page C read. In G read, the sense operation is sensing four memory states of the conducting C, D, E, and F state memory cells if only memory cells identified in the current upper page read are locked out. In G read, the sense operation is sensing one conducting memory cell state in an F memory state if C, D, and E state memory cells identified in the prior middle page F read are additionally locked out. Therefore, utilizing information in a prior middle page F read in comparison to a prior C read level in a current upper page read results in locking out three additional memory states out of four conductive memory states sensed in the G read.

Figure 8:
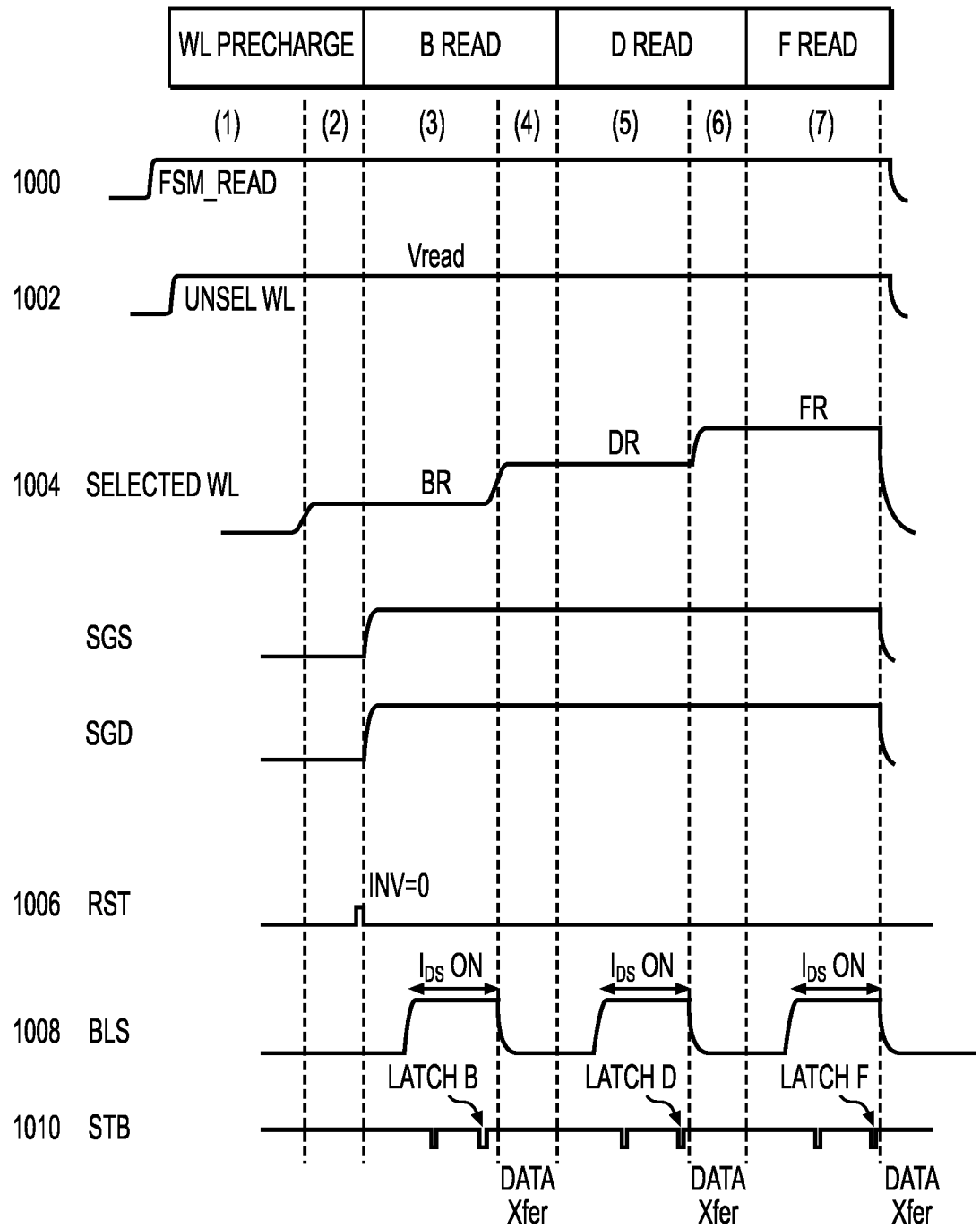
FIG. 8 is a timing diagram that illustrates the operation of the sense module shown in FIG. 5 during the 3-pass read as applied to a NAND memory cell that is part of a memory page in parallel according to aspects of the disclosure.

FIG. 8 is a timing diagram of the operation of the sense module 130, 480 shown in FIG. 1 and FIG. 5 during the 3-pass read as applied to a NAND memory cell that is part of a memory page in parallel, but other timing, and sense modules are possible. The timing diagram will be described in reference to middle page read of the 2-3-2 read scheme of FIGS. 7A-7B. This example shows a 3-level read of B read, D read, and F read relative to demarcation threshold voltage of $D_B$, demarcation threshold voltage $D_D$, and demarcation threshold $D_F$ respectively. At the beginning of each read level, the memory cells which are not locked out will have their bit lines selected for precharged. The locked out memory cells will be discharged to ground. Selected word lines signal are supplied a voltage to the control gate of the selected cell in the NAND string to set a demarcation threshold voltage, such as a demarcation threshold voltage $D_B$ in anticipation of the B read suboperation. A strobe signal STB enables a latching of the results of the read suboperation.

FIG. 8 shows the read operation to be divided into seven phases, with phases (1) and (2) grouped under a world line precharge suboperation, followed by phases (3) and (4) under B read, phases (5) and (6) under D read and phase (7) under F read suboperations respectively. Reference numeral 1000 shows that the read operation is timed at the start and end by the FSM_READ signal rising and falling respectively.

The world line precharge suboperation begins at phase (1) with the unselected word lines of the NAND chain precharging with the rise of the Unsel WL signal as shown with reference numeral 1002. This supplies a voltage of Vread (e.g. 5.5V) to the control gates of the unselected cells in the NAND chain in order to turn them fully on. At phase (2), the selected word line of the NAND chain begins precharging with the rise of the Selected WL signal as shown with reference numeral 1004. This supplies a voltage BR to the control gate of the selected cell in the NAND chain and effectively sets the demarcation threshold voltage $D_B$ in anticipation of the B read suboperation to follow.

The B read suboperation begins at phase (3) with the signal RST resetting the sense amplifier's output signal INV to zero (reference numeral 1006). At the same time, the NAND chain is enabled for connection to the bit line by the signals SGS and SGD turning on a pair of select transistors of the NAND chain. The bit line is then coupled to the sense module by an enabling signal BLS (reference numeral 1008). At that moment, the precharge/clamp circuit 640 in the sense module charges up the bit line to a predetermined voltage (e.g. 0.5V) against a draining conduction current, IDs, of the memory cell (shown as "IDs ON" in reference numeral 1008 of FIG. 8). As soon as the bit line voltage is stable, a strobe signal STB enables a latching of the result of the cell current discriminator 650 into the latch 660 (shown as "Latch B" or "Latch D" or "Latch F" in reference numeral 1010 of FIG. 8). If the programmed threshold voltage of the memory cell is less than that of the demarcation threshold $D_B$, (or equivalently, the cell's conduction current is higher than a demarcation current) the node SEN or SEN2 will be drained down to LOW by the conduction current. This will result in a latch result with an INV signal at HIGH. Conversely, if the programmed threshold voltage of the memory cell is higher than $D_B$, SEN2 will be detected to be HIGH and INV will be latched LOW. As soon as the data from the sense amplifier is latched, the signal BLS goes LOW, thereby disconnecting the memory cell from the sense module.

For those higher current memory cells where the sensing results in the signal INV being latched at HIGH, a pull-down circuit 486 pulls down their bit lines to ground. This effectively turns off the conduction currents and the power drain of those memory cells. In a preferred implementation, an additional earlier reading (see first strobe STB in phase (3) of reference numeral 1010) is made by the sense amplifier with a limited bit line pull-up. This will identify those memory cells with even higher conduction current states and have their bit lines latched to ground as soon as possible in order to turn off their conduction currents.

In phase (4), the data in the SEN2 is transferred out via the readout bus 499 when the transfer gate 488 is enabled by the signal NCO. This is denoted by "Data Xfer" in reference numeral 1010 of FIG. 8.

The suboperations D read and F read are each similar to that of B read, with corresponding shifting of the selected WL voltage to DR and FR respectively.

According to an aspect, it may be preferable to sense progressively from the lower threshold voltage (such as from state "B"). This means the higher current cells are identified first for early disposal. If the cell has a programmed threshold voltage less than $D_B$, it is regarded as a conducting cell. The conducting cell will be discharged to the ground after sensing at "B". This effectively turns off the conduction current in the cell. If the cell has a programmed threshold voltage higher than $D_B$, then it is regarded as non-conducting at "B" and the bit line will be kept at a constant value and not discharged. For the second suboperation of sensing at "D" level, only the bit lines of the non-conducting cells at "B" need be selectively charged up. This means that the sense module latches for the page are not reset to force INV back to zero (i.e., not reset to clear the bit line pulldown with INV=1). In this way, the cells which have a programmed threshold voltage less than $D_B$ will not be charged up, thereby saving power. It will be seen that with each successive sensing, more and more of the memory cell in the page are turned off as they are irrelevant to subsequent sensing. In this way, the power drained by the memory cells in the page is minimized.

While the example described refers to a read operation involving three demarcation threshold voltages, the methods and principle described are generally applicable to read operations with more than one pass where subsequent passes can take advantage of information obtained in an earlier pass to selectively turn off the cells irrelevant to the current pass.

It should also be noted that in conventional implementations, the sensing relative to each memory state is independent of each other. That is, each sensing will go through exactly same number of steps, i.e., from phase (1) to phase (4) for each of B read, D read and F read. In the present sensing, only the first read pass, B read will reset all the sense amplifier's latches of the page to INV=0 in order to precharge all the bit lines in the page. Subsequent sensing will only charge up those bit lines with INV=0 while not charging those bit lines that have their INV's flipped during previous sensing.

In certain embodiments, the term identifying memory cells in a read level may include those memory cells that are locked out since those memory cells should have been identified in the read level. In certain embodiments, it is understood that locking out memory cells in a read level may utilize information or latches from one or more prior read levels from a prior page read alone or in combination with a current page read.

As discussed, memory cells may have threshold voltage windows partitioned into several regions representing several memory states. The regions are demarcated by the set of demarcation threshold voltages. Comparing the programmed threshold voltage with a plurality of demarcation threshold voltages when sensing a memory cell determines in which region the programmed threshold voltage lies. At a subsequent page read, the memory cells with programmed threshold voltages lower than the current demarcation threshold voltage can be identified from a prior page read and can be locked out. Thus, turning-off or inhibiting the conduction current of the previously identified memory cells from prior page reads (alone or in combination with previously identified memory cells form a prior read level from a current page read) reduces the current and power consumed.

Figure 9:
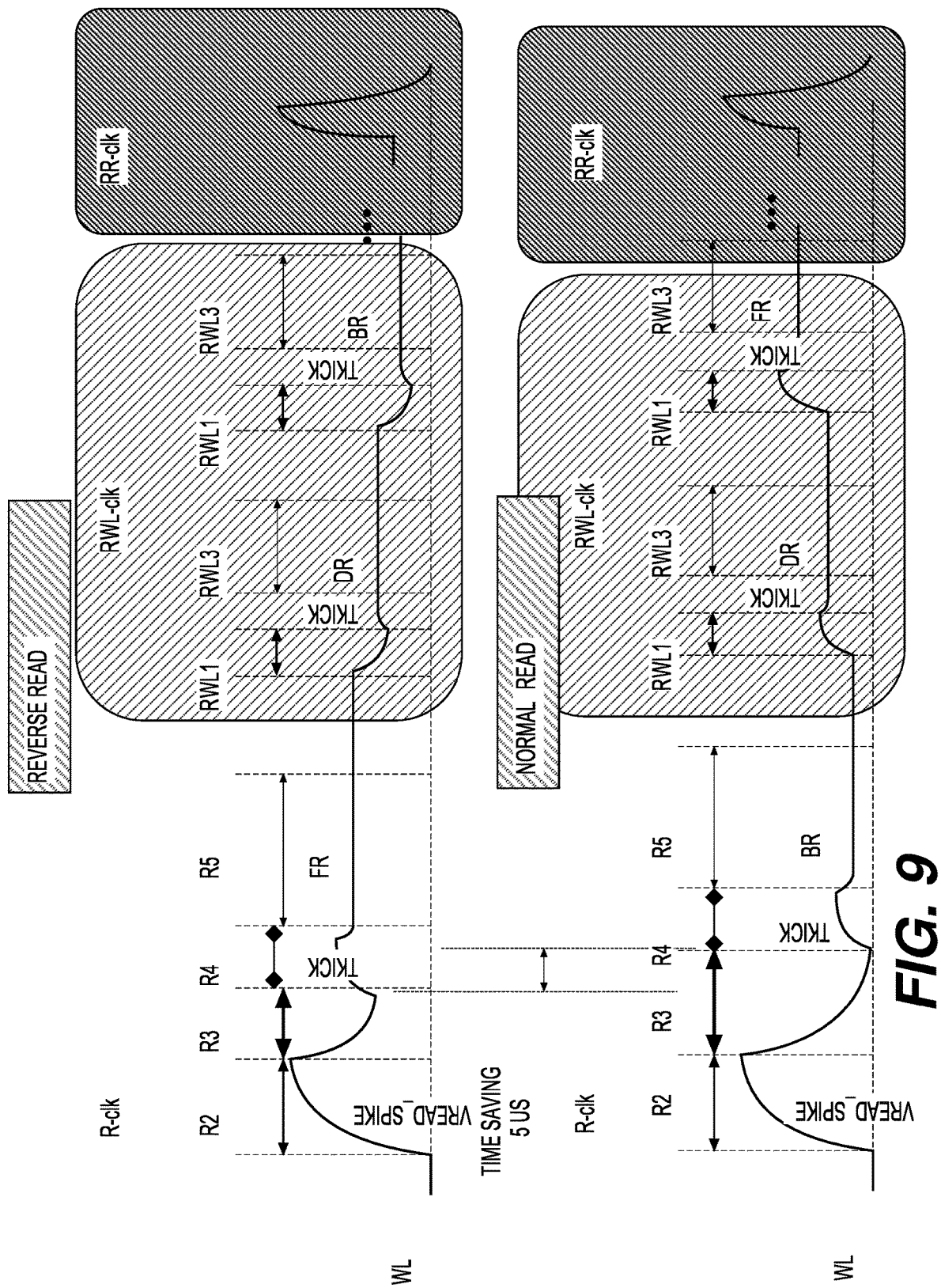
FIG. 9 shows an example series of read voltages applied to a selected word line for both a normal read and a reverse read when reading a middle page according to aspects of the disclosure.

FIG. 9 shows an example series of read voltages applied to a selected word line for both a normal read and a reverse read when reading a middle page. Various time periods or portions of the period of time in which the read operation occurs are shown. These time periods include a first verify stage R-clk, a second program-verify stage RWL-clk, and a discharge stage RR-clk. The first verify stage R-clk is further divided into periods including a second portion R2, third portion R3, fourth portion R4, and settling period R5 of the first verify stage R-clk. Similarly, the second program-verify stage RWL-clk can include periods RWL1 and RWL3. In addition, a "kicking voltage" (i.e., an overshoot or undershoot of the voltage) may be applied to the selected word line in the time period labeled Tkick (e.g., during R4 and between RWL1 and RWL3) to help the voltage on the selected word line reach the target or reference voltage more quickly. As shown, for the normal read (upper portion of FIG. 9), the series of read voltages become increasing higher in magnitude with each successive data state that is being sensed. In contrast, for the reverse order read or reverse read (lower portion of FIG. 9), the read voltages of the series become increasing lower in magnitude with each successive data state that is being sensed. FIG. 10 is a table illustrating the sequences of the data states being sensed for each of a lower page, middle page, and upper page for both the normal read and the reverse read. As previously discussed, the reverse read can improve the speed of the read operation by reducing the transition from the initial voltage spike (VREAD_SPIKE) to the first one of the series of read voltages. For example, with the middle page read, the word line voltage ramps from VREAD_SPIKE(~10V) to the F state (~5V), in contrast with normal read sequence the word line voltage ramps down from VREAD_SPIKE(~10V) to B state (~1V).

As discussed above, memory apparatuses may have limited ability to provide negative voltages to the word lines. Yet, as 3D NAND technology nodes shrink in size, neutral threshold voltages Vt of the memory cells are subsequently reduced. Therefore, the natural trend is to extend the threshold Vt operation window to be more negative to (i) gain more data retention benefit (ii) provide flexibility for deeper erase. FIGS. 11A-11B show threshold voltage Vt windows using negative word lines (NWL) and not using negative word lines. Indeed, in some memory apparatuses (e.g., BiCS6), negative word line voltages are utilized. Since neutral Vt will keep decreasing for future generation, it can be expected that the "optimal" threshold voltage Vt window will become increasingly more negative in future memory apparatuses (e.g., BiCS7, BiCS8 and beyond). FIG. 12 shows a plot of threshold voltages of a plurality of memory cells with and without negative word line voltages. As shown, the threshold voltage Vt budget is significantly improved after high temperature data retention (HTDR) by shifting the threshold voltage Vt window to negative side by approximately −1.2 a.u. Due to fundamental design limitations (e.g., analog pump limitation), the maximum negative word line voltage capability or predetermined voltage design limit is approximately −2.4 a.u. for some memory apparatuses. Thus, for such memory apparatuses, it is difficult to provide voltage <−2.4 a.u.

Figure 13:
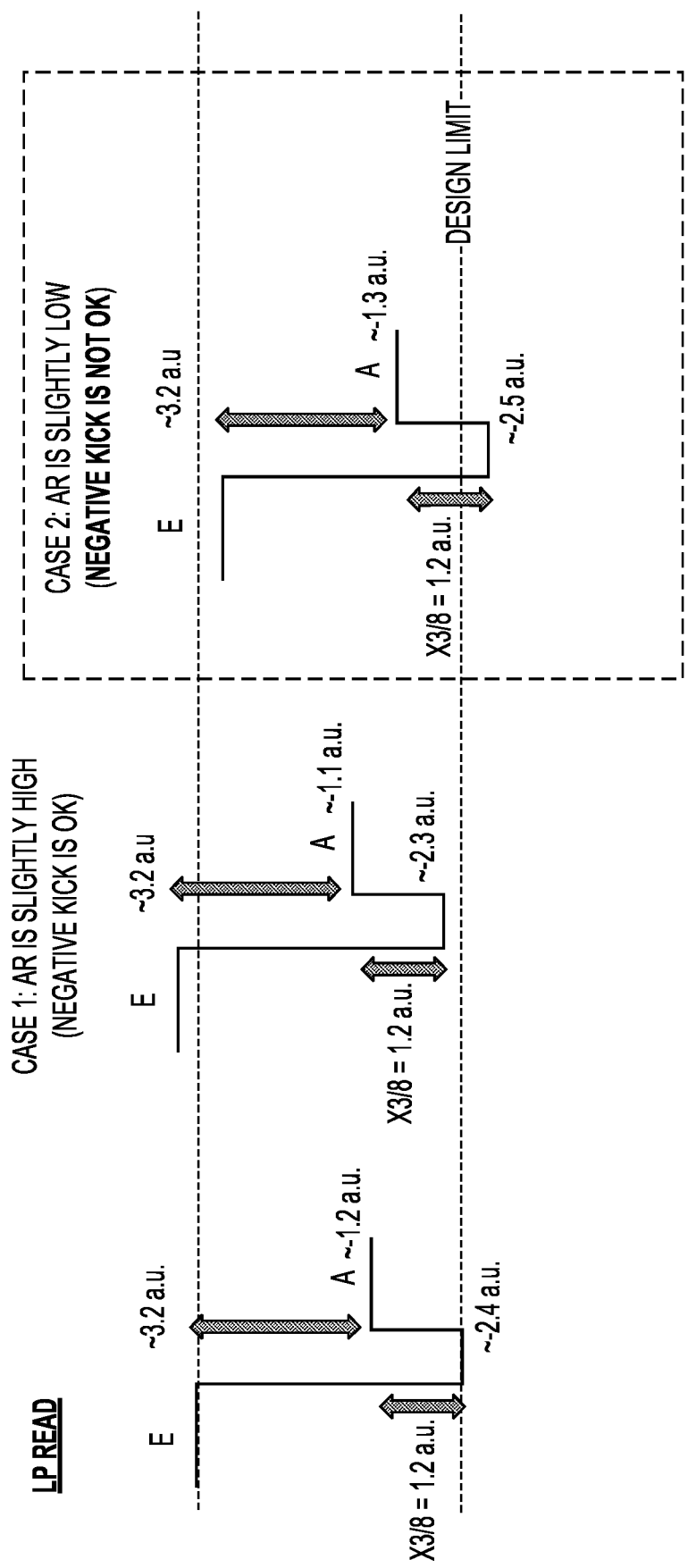
FIG. 13 shows plots of word line voltages during a lower page read with a transition from a read reference voltage for an E state to the read reference voltage for an A state and including a negative kicking voltage in three different situations according to aspects of the disclosure.

In addition, some memory apparatuses use the reverse read, where TLC read is sensing high threshold voltage Vt state first, then low threshold voltage Vt state (e.g., upper portion of FIG. 9). Specifically, in 2-3-2 gray coding, the word line voltage during a lower page (LP) read transitions from the read reference voltage for the E state (ER) to the read reference voltage for the A state (AR), with a negative kick (to accelerate WL settling time). Consequently, the minimum voltage level can hit the predetermined voltage design limit (~2.4 a.u.). FIG. 13 shows plots of word line voltages during a lower page read with a transition from the read reference voltage for the E state (ER) to the read reference voltage for the A state (AR) and including a negative kicking voltage in three different situations. Specifically, in the leftmost portion of FIG. 13, the predetermined voltage design limit BiCS6 negative kick is expected marginally hit design limitation is hit or reached. In the middle portion of FIG. 13 (labeled case 1), the predetermined voltage design limit is not reached (the negative kicking voltage is acceptable). In the rightmost portion of FIG. 13 (labeled case 2), the predetermined voltage design limit is exceeded (the negative kicking voltage is not acceptable).

Because the negative kicking voltage is expected to marginally hit or reach the design limitation for some memory apparatuses, some word lines in such memory apparatuses cannot employ the proper negative kicking voltage. In addition, some memory cells require a lower read reference voltage (e.g., AR) due to (i) chip to chip variation and/or (ii) dynamic read/BES read. When the memory apparatus cannot provide the proper negative kicking voltage, word line settling time is compromised, leading to higher failure bit count (FBC). Improper negative kicking voltage also leads to insufficient word line overdrive and read performance or read time (tR) will be slower.

Figure 14:
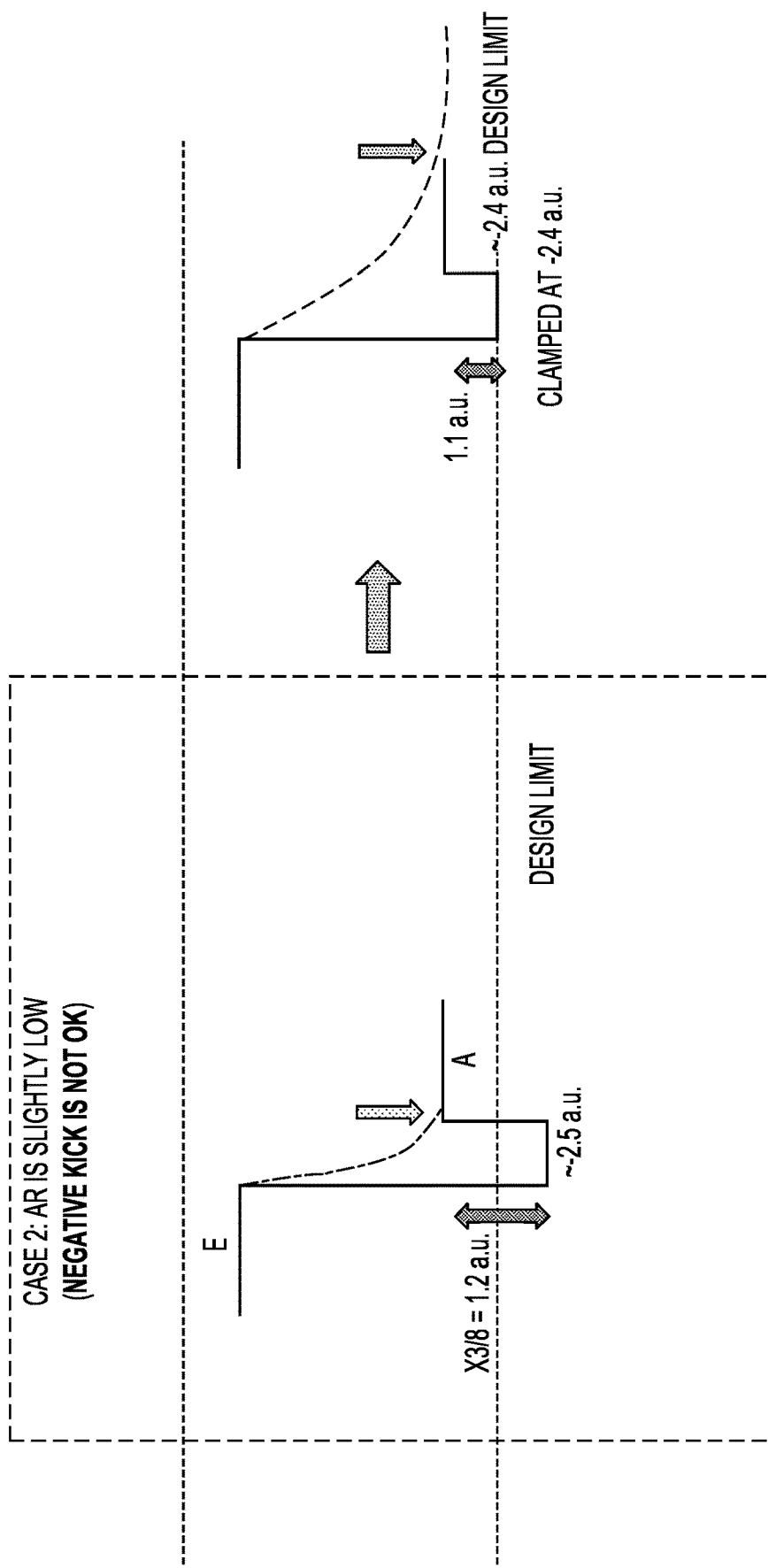
FIG. 14 shows plots of word line voltages during the lower page read with the transition from the read reference voltage for the E state to the read reference voltage for the A state and including the negative kicking voltage along with far side word line voltage overlaid according to aspects of the disclosure.

In more detail, when the design limit (e.g., −2.4 a.u.) is reached, the control circuit cannot provide −2.5 a.u. Instead, the control circuit only provides −2.4 a.u. (i.e., it is clamped at the minimum), which means the "negative kick" will be less efficient than ideal case. FIG. 14 shows plots of word line voltages during the lower page read with the transition from the read reference voltage for the E state (ER) to the read reference voltage for the A state (AR) and including the negative kicking voltage along with far side word line voltage overlaid. The word line voltage of the word line (especially the physical portion at far from the row decoder side) cannot quickly settle to the desired sensing voltage or read reference voltage (e.g., AR) as shown in the dashed line of the leftmost plot of FIG. 14. As a result, without any compensation, the physical word line needs a "longer than expected" settling time before sensing, as shown in the dashed line of the rightmost plot of FIG. 14. This leads to either (i) "longer than expected" tR (read performance), or (ii) higher fail bit count (FBC).

Consequently, described herein is a memory apparatus (e.g., memory device 100 in FIG. 1) including memory cells (e.g., memory cell 10 in FIG. 2) connected to one of a plurality of word lines (e.g., $WL_0$-$WL_{31}$ in FIG. 5). The memory cells are arranged in one or more strings (e.g., string 50 in FIG. 5) and each is configured to retain a threshold voltage Vt or Vth corresponding to one of a plurality of memory states (e.g., "Er", "A", "B", "C", "D", "E", "F" and "G" in FIG. 4). The apparatus also includes a control circuit (e.g., control circuitry 110, controller 122, row decoder 124, source control circuits 127, read write circuits 128, sense modules 130, and column decoder 132 in FIG. 1) coupled to the plurality of word lines and the strings. The control circuit is configured to compute a target word line voltage including a kicking voltage to be applied to selected ones of the plurality of word lines for a kick time during a read operation. The control circuit is also configured to extend the kick time by a compensation time $\Delta T_{kick}$ to a compensated kick time $T_{kick2}+\Delta T_{kick}$ (e.g., using timer 113a of FIG. 1) in response to determining the target word line voltage is not greater than a predetermined voltage design limit. In addition, the control circuit is configured to apply the kicking voltage to the selected ones of the plurality of word lines for the compensated kick time $T_{kick2}+T_{kick}$ thereby enabling a word line voltage of the selected ones of the plurality of word lines to quickly (i.e., faster than if no kicking voltage was utilized and/or if the kicking voltage was not an ideal magnitude) reach one of a plurality of reference voltages without exceeding the predetermined voltage design limit. So, the control circuit utilizes a pre-calculation of the target word line voltage, based on which an additional compensation time $\Delta T_{kick}$ (i.e., lengthening the kick time) is not triggered when target voltage is within the design limitation or triggered when the target word line voltage hits/exceed design limitation. The compensation time $\Delta T_{kick}$ allows the negative kicking voltage to stay at a minimum for an extended time that allows the negative overdrive to accelerate word line settling. So, according to an aspect, the control circuit is further configured to minimize a time for settling the word line voltage of the selected ones of the plurality of word lines.

More specifically, in response to determining the target word line voltage is not greater than the predetermined voltage design limit, the control circuit is further configured to increase the kicking voltage applied to each of the plurality of word lines for the compensated kick time $T_{kick2}+\Delta T_{kick}$ to the predetermined voltage design limit. Since the word line voltage would otherwise have a negative magnitude beyond the predetermined voltage design limit, the kicking voltage must be increased to a higher voltage to prevent the word line voltage from exceeding the predetermined voltage design limit. According to an aspect, the control circuit is further configured to determine the compensated kick time $T_{kick2}+\Delta T_{kick}$ based on the target word line voltage. In other words, the control circuit or controller estimates what the word line voltage needs to be with an ideal kicking voltage, and the compensated kick time $T_{kick2}+\Delta T_{kick}$ is determined based on the magnitude of this target word line voltage.

Figure 15:
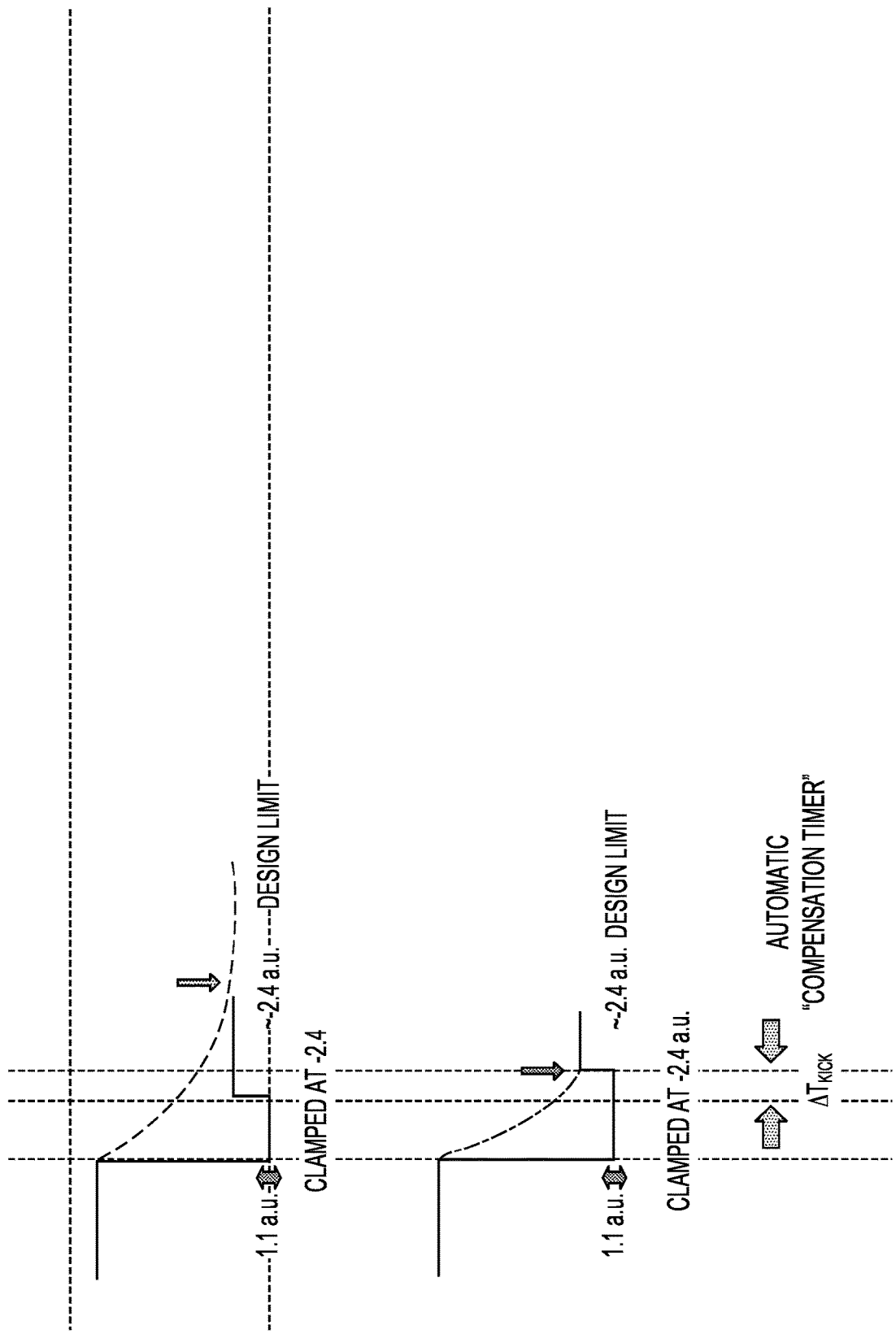
FIG. 15 shows plots of word line voltages during the lower page read with the transition from a primary read voltage to a secondary read and including the negative kicking voltage along with far side word line voltage overlaid according to aspects of the disclosure.

FIG. 15 shows plots of word line voltages during the lower page read with the transition from a primary read voltage (e.g., the reference voltage for the E state (ER)) to a secondary read voltage (e.g., the reference voltage for the A state (AR)) and including the negative kicking voltage along with far side word line voltage overlaid. Specifically, the uppermost plot of FIG. 15 shows a word line voltage with a longer than expected settling time before sensing, as shown in the dashed line, due to the insufficient kicking voltage. In comparison, the use of the compensation time $\Delta T_{kick}$ compensates the voltage shortage by taking advantage of voltage-time "equivalence", as shown in the lowermost plot of FIG. 15. While the negative kicking voltage cannot be on target, the additional compensation time $\Delta T_{kick}$ causes the word line to overdriven for a longer time, which helps recover the word line settling time as indicated with the dashed line of the lowermost plot of FIG. 15.

Referring back to FIG. 4, the threshold voltage Vt possible for each of the memory cells spans a threshold window partitioned into a plurality of regions for the plurality of memory states demarcated by a plurality of demarcation threshold voltages $D_A$, $D_B$, $D_C$, $D_D$, $D_E$, $D_F$, $D_G$. The plurality of demarcation threshold voltages $D_A$, $D_B$, $D_C$, $D_E$, $D_F$, $D_G$ demarcate between the plurality of memory states. The plurality of memory states includes an erased state Er associated with one of the plurality of regions corresponding to the threshold voltage Vt being lower compared to others of the plurality of regions representing at least one programmed state the at least one programmed state includes, in order of the threshold voltage Vt increasing in magnitude, a first data state A and a second data state B and a third data state C and a fourth data state D and a fifth data state E and a sixth data state F and a seventh data state G. According to an aspect, the read operation is a page read discerning a plurality of lower bits and a plurality of middle bits and a plurality of upper bits encoded with a Gray code using a 2-3-2 read scheme. Thus, the control circuit is configured to apply the kicking voltage to the selected ones of the plurality of word lines for the compensated kick time $T_{kick2}+\Delta T_{kick}$ when transitioning between reading the fifth data state E and first data state A to read the plurality of lower bits without exceeding the predetermined voltage design limit (e.g., −2.4 a.u.).

According to an aspect, the plurality of demarcation threshold voltages $D_A$, $D_B$, $D_C$, $D_D$, $D_E$, $D_F$, $D_G$ includes a primary demarcation threshold voltage (e.g., $D_E$) associated with one of the plurality of memory states and a secondary demarcation threshold voltage (e.g., $D_A$) associated with another of the plurality of memory states. The kick time includes a first kick time $T_{kick1}$ and a second time $T_{kick2}$. The plurality of reference voltages includes a primary read voltage corresponding to the primary demarcation threshold voltage (e.g., ER) and a secondary read voltage (e.g., AR) corresponding to the secondary demarcation threshold voltage. Thus, the control circuit is further configured to ramp the word line voltage of the selected ones of the plurality of word lines up to an initial word line voltage Vread (e.g., approximately 8 a.u.) while applying a read pass voltage to unselected ones of the plurality of word lines in response to receiving a read command. The control circuit is also configured to ramp the word line voltage of the selected ones of the plurality of word lines down to the primary read voltage ER minus a first delta kick voltage $\Delta_{kick1}$ for the first kick time $T_{kick1}$. The control circuit is also configured to ramp the word line voltage up to the primary read voltage ER and sense conduction currents of the memory cells of the strings to identify the memory cells of the strings having the threshold voltage Vt less than the primary demarcation threshold voltage. In addition, the control circuit is configured to compute the target word line voltage $AR-\Delta_{kick2}$ of the kicking voltage to be applied to the selected ones of the plurality of word lines for a second kick time $T_{kick2}$ as the secondary read voltage AR minus a second delta kick voltage $\Delta_{kick2}$ during the read operation. So, the target voltage or target word line voltage $AR-\Delta_{kick2}$ is precomputed (e.g., by the control circuit). The control circuit is then configured to determine whether the target word line voltage $AR-\Delta_{kick2}$ is greater than or equal to the predetermined voltage design limit (e.g., −2.4 a.u.). The control circuit ramps the word line voltage of the selected ones of the plurality of word lines down to the secondary read voltage AR minus the second delta kick voltage $\Delta_{kick2}$ for the second kick time $T_{kick2}$ in response to determining the target word line voltage $AR-\Delta_{kick2}$ is greater than or equal to the predetermined voltage design limit. The control circuit is configured to extend the second kick time $T_{kick2}$ by the compensation time $\Delta T_{kick}$ to the compensated kick time $T_{kick}2+\Delta T_{kick}$ and ramp the word line voltage of the selected ones of the plurality of word lines down to the predetermined voltage design limit for the compensated kick time $T_{kick2} \Delta T_{kick}$ in response to determining the target word line voltage is not greater than the predetermined voltage design limit. Thus, if the target word line voltage $AR-\Delta_{kick2}$ exceeds design limit (e.g., <−2.4 a.u.), the control circuit triggers the compensation timer (i.e., compensated kick time $T_{kick2}+\Delta T_{kick}$), which, according to an aspect, is a function of target word line voltage $AR-\Delta_{kick2}$. Consequently, such a "longer kick" (i.e., due to the compensation time $\Delta T_{kick}$) largely helps the "smaller kick" (i.e., the kicking voltage having a less than ideal magnitude) and the word line settling time can be recovered. The control circuit ramps the word line voltage up to the secondary read voltage AR and senses the conduction currents of the memory cells of the strings to identify the memory cells of the strings having the threshold voltage Vt less than the secondary demarcation threshold voltage. While the at least one reference voltage and target word line voltage are discussed with reference to the fifth data E and the first data state A, it should be appreciated that the at least one reference voltage and target word line voltage may be associated transitions between any memory states.

Referring back to FIG. 1, the memory apparatus can include a storage region (e.g., storage region 113 of FIG. 1). According to an aspect, the storage region stores a compensation time look up table having a plurality of values of the compensation time $\Delta T_{kick}$ (e.g., DT1, DT2, DT3, DT4, DT5, DT6, DT7) each corresponding to one of a plurality of values of the target word line voltage $AR-\Delta_{kick2}$ Alternatively, or in addition, the compensation time look up table may be stored in the Romfuse or as a parameter for user/developer "trim". FIG. 16 is an exemplary compensation time look up table. The control circuit is configured to select one of the plurality of values of the compensation time $\Delta T_{kick}$ (e.g., DT1, DT2, DT3, DT4, DT5, DT6, DT7) associated with the one of the plurality of values of the target word line voltage $AR-\Delta_{kick2}$ previously computed. So, from such a pre-defined look-up table, the compensation time $\Delta T_{kick}$ will be applied to extend the duration of the "small kick".

As discussed above, negative word line voltages are utilized in some memory apparatuses. So, according to an aspect, one or more of the plurality of demarcation threshold voltages $D_A$, $D_B$, $D_C$, $D_D$, $D_E$, $D_F$, $D_G$ of the threshold window associated with the at least one programmed state are negative voltages.

Figure 17:
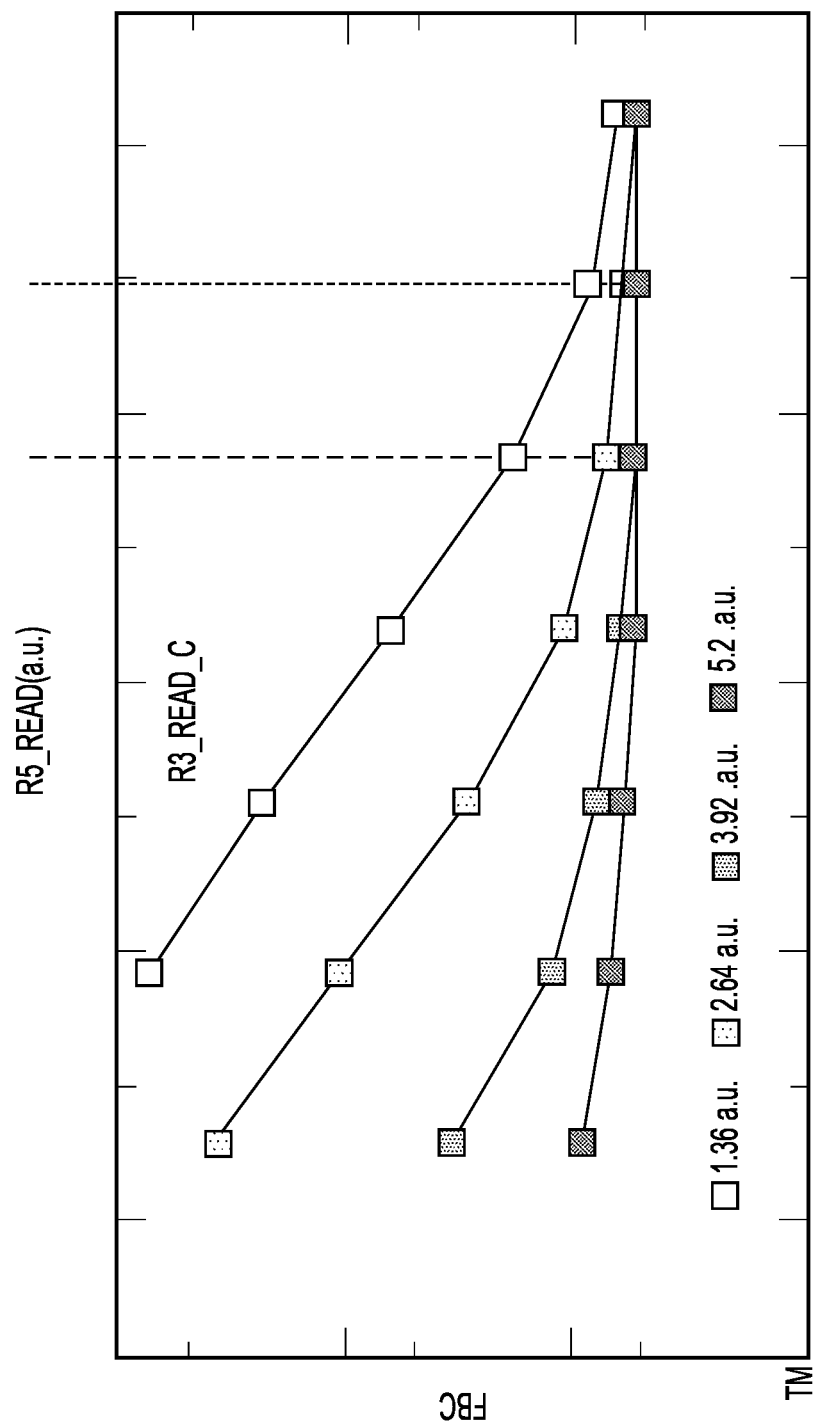
FIG. 17 shows a failure bit count (FBC) plotted versus read time for different durations of the kick time according to aspects of the disclosure.

FIG. 17 shows a failure bit count (FBC) plotted versus read time for different durations of the kick time. As shown, with a negative kick having a 5.2 a.u. duration, the word line needs approximately an additional 4.5 a.u. to fully stabilize. With a negative kick having a 1.36 a.u. duration, the word line needs approximately an extra 11.5 a.u. to fully stabilize. Comparing these two cases, for example, even if the kick time is lengthened to 5.2 a.u., the word line settling time is improved. Consequently, the total read time tR is better by >3 a.u. and net read time tR is a gain.

A method of operating a memory apparatus is also provided. As discussed above, the memory apparatus includes memory cells connected to one of a plurality of word lines and arranged in strings and configured to retain a threshold voltage Vt corresponding to one of a plurality of memory states. Thus, the method includes the step of computing a target word line voltage including a kicking voltage to be applied to selected ones of the plurality of word lines for a kick time during a read operation. The method continues with the step of extending the kick time by a compensation time $\Delta T_{kick}$ to a compensated kick time $T_{kick2}+\Delta T_{kick}$ in response to determining the target word line voltage is not greater than a predetermined voltage design limit. The method proceeds by applying the kicking voltage to the selected ones of the plurality of word lines for the compensated kick time $T_{kick2}+\Delta T_{kick}$ thereby enabling a word line voltage of the selected ones of the plurality of word lines to reach one of a plurality of reference voltages without exceeding the predetermined voltage design limit.

In the case where the word line voltage would otherwise have a negative magnitude beyond the predetermined voltage design limit, the kicking voltage can be increased to a higher voltage to prevent the word line voltage from exceeding the predetermined voltage design limit. Thus, the method further includes the step of increasing the kicking voltage applied to each of the plurality of word lines for the compensated kick time $T_{kick2}+\Delta T_{kick}$ to the predetermined voltage design limit in response to determining the target word line voltage is not greater than the predetermined voltage design limit. According to an aspect, the method further includes the step of determining the compensated kick time $T_{kick2}+\Delta T_{kick}$ based on the target word line voltage.

As discussed, a series of a plurality of demarcation threshold voltages demarcate between the plurality of memory states. The plurality of demarcation threshold voltages $D_A$, $D_B$, $D_C$, $D_D$, $D_E$, $D_F$, $D_G$ includes a primary demarcation threshold voltage (e.g., $D_E$) associated with one of the plurality of memory states and a secondary demarcation threshold voltage (e.g., $D_A$) associated with another of the plurality of memory states. The kick time includes a first kick time $T_{kick1}$ and a second time $T_{kick2}$. The plurality of reference voltages includes a primary read voltage (e.g., ER) corresponding to the primary demarcation threshold voltage and a secondary read voltage (e.g., AR) corresponding to the secondary demarcation threshold voltage.

Figure 18:
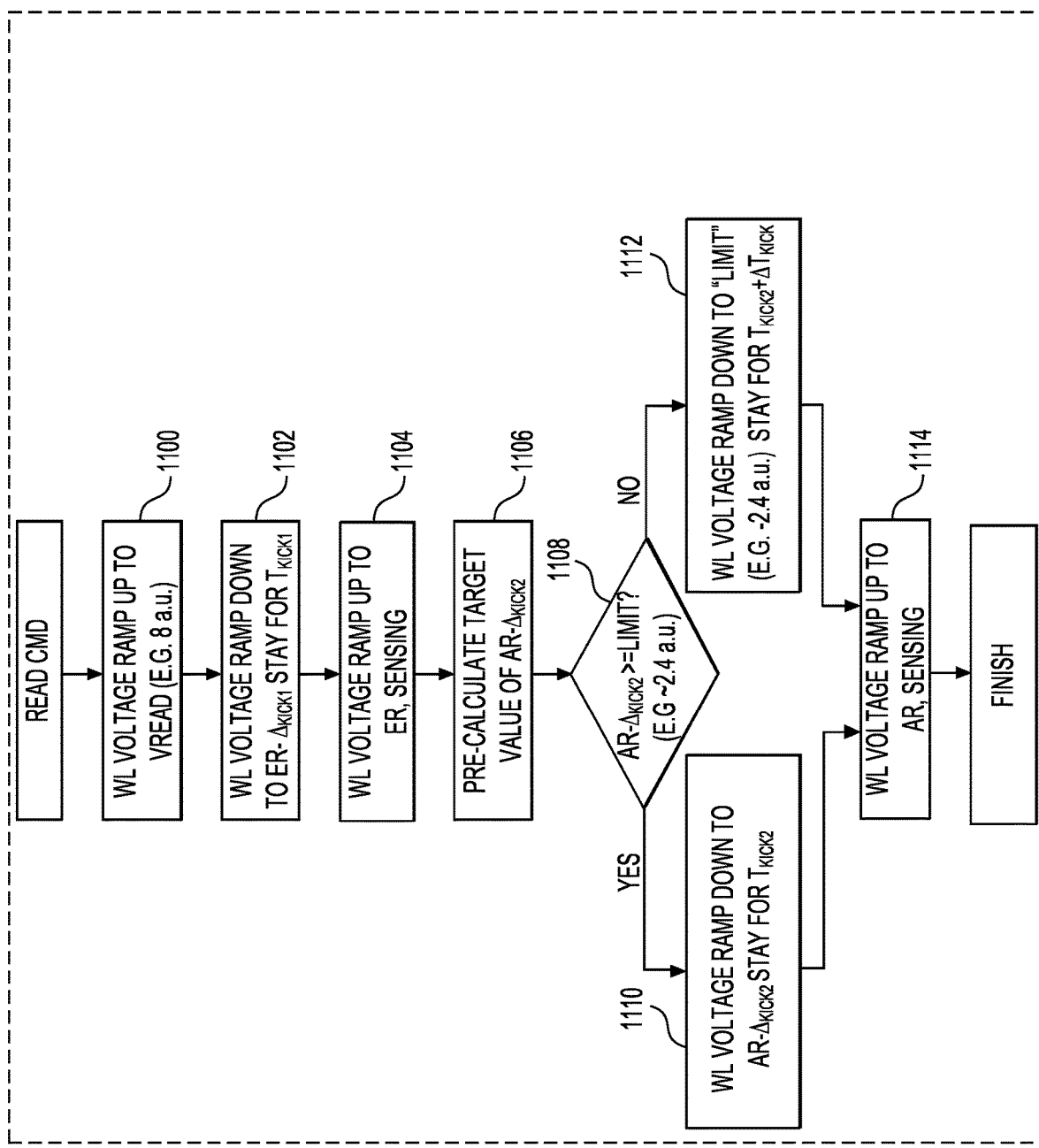
FIG. 18 illustrates steps of a method of operating a memory apparatus according to aspects of the disclosure.

Thus, as best shown in FIG. 18, the method further includes the steps of 1100 ramping the word line voltage of the selected ones of the plurality of word lines up to an initial word line voltage Vread (e.g., approximately 8 a.u.) while applying a read pass voltage to unselected ones of the plurality of word lines in response to receiving a read command. The method continues with the step of 1102 ramping the word line voltage of the selected ones of the plurality of word lines down to the primary read voltage ER minus a first delta kick voltage $\Delta_{kick1}$ for the first kick time $T_{kick1}$. The next step of the method is 1104 ramping the word line voltage up to the primary read voltage ER and sensing conduction currents of the memory cells of the strings to identify the memory cells of the strings having the threshold voltage Vt less than the primary demarcation threshold voltage. The method proceeds by 1106 computing the target word line voltage AR-$\Delta_{kick2}$ of the kicking voltage to be applied to the selected ones of the plurality of word lines for a second kick time $T_{kick2}$ as the secondary read voltage AR minus a second delta kick voltage $\Delta_{kick2}$ during the read operation. The method also includes the step of 1108 determining whether the target word line voltage AR-$\Delta_{kick2}$ is greater than or equal to the predetermined voltage design limit (e.g., <−2.4 a.u.). The method continues with the step of 1110 ramping the word line voltage of the selected ones of the plurality of word lines down to the secondary read voltage AR minus the second delta kick voltage $\Delta_{kick2}$ for the second kick time in response to determining the target word line voltage AR-$\Delta_{kick2}$ is greater than or equal to the predetermined voltage design limit. Next, 1112 extending the second kick time $T_{kick2}$ by the compensation time $\Delta T_{kick}$ to the compensated kick time $T_{kick}2+\Delta T_{kick}$ and ramping the word line voltage of the selected ones of the plurality of word lines down to the predetermined voltage design limit for the compensated kick time $T_{kick}2+\Delta T_{kick}$ in response to determining the target word line voltage AR-$A_{kick2}$ is not greater than the predetermined voltage design limit. The next step of the method is 1114 ramping the word line voltage up to the secondary read voltage AR and sensing the conduction currents of the memory cells of the strings to identify the memory cells of the strings having the threshold voltage Vt less than the secondary demarcation threshold voltage.

Again, the memory apparatus further includes a storage region (e.g., storage region 113 of FIG. 1) storing a compensation time look up table having a plurality of values of the compensation time $\Delta T_{kick}$ each corresponding to one of a plurality of values of the target word line voltage AR-$\Delta_{kick2}$. Thus, the method further includes the step of selecting one of the plurality of values of the compensation time $\Delta T_{kick}$ associated with the one of the plurality of values of the target word line voltage AR-$\Delta_{kick2}$ previously computed.

As discussed above, the threshold voltage Vt possible for each of the memory cells spans a threshold window partitioned into a plurality of regions for the plurality of memory states demarcated by a plurality of demarcation threshold voltages $D_A$, $D_B$, $D_C$, $D_D$, $D_E$, $D_F$, $D_G$. The plurality of memory states includes an erased state associated with one of the plurality of regions corresponding to the threshold voltage Vt being lower compared to others of the plurality of regions representing at least one programmed state. One or more of the plurality of demarcation threshold voltages $D_A$, $D_B$, $D_C$, $D_D$, $D_E$, $D_F$, $D_G$ of the threshold window associated with the at least one programmed state are negative voltages.

The advantages of the memory apparatus and method disclosed herein include automatically compensated word line settling time even if the design limitation or the predetermined voltage design limit is hit or exceeded. In addition, faster read performance or read time (tR) or better fail bit count (FBC) is also provided. So, with the memory apparatus and method disclosed herein, the NAND circuit (e.g., the control circuit) automatically compensates the "voltage clamping effect" and can recover the read time tR loss (at least partially).

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:
   memory cells connected to one of a plurality of word lines and arranged in strings and configured to retain a threshold voltage corresponding to one of a plurality of memory states; and
   a control circuit coupled to the plurality of word lines and the strings and configured to:
   compute a target word line voltage including a kicking voltage to be applied to selected ones of the plurality of word lines for a kick time during a read operation,
   extend the kick time by a compensation time to a compensated kick time in response to determining the target word line voltage is not greater than a predetermined voltage design limit, and
   apply the kicking voltage to the selected ones of the plurality of word lines for the compensated kick time thereby enabling a word line voltage of the selected ones of the plurality of word lines to reach one of a plurality of reference voltages quickly without exceeding the predetermined voltage design limit.

2. The memory apparatus as set forth in claim 1, wherein the control circuit is further configured to determine the compensated kick time based on the target word line voltage.

3. The memory apparatus as set forth in claim 2, further including a storage region storing a compensation time look up table having a plurality of values of the compensation time each corresponding to one of a plurality of values of the target word line voltage and wherein the control circuit is configured to select one of the plurality of values of the compensation time associated with the one of the plurality of values of the target word line voltage previously computed.

4. The memory apparatus as set forth in claim 1, wherein the control circuit is further configured to increase the kicking voltage applied to each of the plurality of word lines for the compensated kick time to the predetermined voltage design limit in response to determining the target word line voltage is not greater than the predetermined voltage design limit.

5. The memory apparatus as set forth in claim 1, wherein a series of a plurality of demarcation threshold voltages demarcate between the plurality of memory states, the plurality of demarcation threshold voltages includes a primary demarcation threshold voltage associated with one of the plurality of memory states and a secondary demarcation threshold voltage associated with another of the plurality of memory states, the kick time includes a first kick time and a second kick time, the plurality of reference voltages includes a primary read voltage corresponding to the primary demarcation threshold voltage and a secondary read voltage corresponding to the secondary demarcation threshold voltage, the control circuit is further configured to:

ramp the word line voltage of the selected ones of the plurality of word lines up to an initial word line voltage while applying a read pass voltage to unselected ones of the plurality of word lines in response to receiving a read command;

ramp the word line voltage of the selected ones of the plurality of word lines down to the primary read voltage minus a first delta kick voltage for the first kick time;

ramp the word line voltage up to the primary read voltage and sense conduction currents of the memory cells of the strings to identify the memory cells of the strings having the threshold voltage less than the primary demarcation threshold voltage;

compute the target word line voltage of the kicking voltage to be applied to the selected ones of the plurality of word lines for a second kick time as the secondary read voltage minus a second delta kick voltage during the read operation;

determine whether the target word line voltage is greater than or equal to the predetermined voltage design limit;

ramp the word line voltage of the selected ones of the plurality of word lines down to the secondary read voltage minus the second delta kick voltage for the second kick time in response to determining the target word line voltage is greater than or equal to the predetermined voltage design limit;

extend the second kick time by the compensation time to the compensated kick time and ramp the word line voltage of the selected ones of the plurality of word lines down to the predetermined voltage design limit for the compensated kick time in response to determining the target word line voltage is not greater than the predetermined voltage design limit; and ramp the word line voltage up to the secondary read voltage and sense the conduction currents of the memory cells of the strings to identify the memory cells of the strings having the threshold voltage less than the secondary demarcation threshold voltage.

6. The memory apparatus as set forth in claim 1, wherein the control circuit is further configured to minimize a time for settling the word line voltage of the selected ones of the plurality of word lines.

7. The memory apparatus as set forth in claim 1, wherein the threshold voltage possible for each of the memory cells spans a threshold window partitioned into a plurality of regions for the plurality of memory states demarcated by a plurality of demarcation threshold voltages, the plurality of memory states includes an erased state associated with one of the plurality of regions corresponding to the threshold voltage being lower compared to others of the plurality of regions representing at least one programmed state, and one or more of the plurality of demarcation threshold voltages of the threshold window associated with the at least one programmed state are negative voltages.

8. The memory apparatus as set forth in claim 7, wherein the at least one programmed state includes, in order of the threshold voltage increasing in magnitude, a first data state and a second data state and a third data state and a fourth data state and a fifth data state and a sixth data state and a seventh data state, the read operation is a page read discerning a plurality of lower bits and a plurality of middle bits and a plurality of upper bits encoded with a Gray code using a 2-3-2 read scheme and the control circuit is configured to apply the kicking voltage to the selected ones of the plurality of word lines for the compensated kick time when transitioning between reading the fifth data state and first data state to read the plurality of lower bits without exceeding the predetermined voltage design limit.

9. A controller in communication with a memory apparatus including memory cells connected to one of a plurality of word lines and arranged in strings and configured to retain a threshold voltage corresponding to one of a plurality of memory states, the controller configured to:

compute a target word line voltage including a kicking voltage to be applied to selected ones of the plurality of word lines for a kick time during a read operation;

instruct the memory apparatus to extend the kick time by a compensation time to a compensated kick time in response to determining the target word line voltage is not greater than a predetermined voltage design limit; and instruct the memory apparatus to apply the kicking voltage to the selected ones of the plurality of word lines for the compensated kick time thereby enabling a word line voltage of the selected ones of the plurality of word lines to reach one of a plurality of reference voltages quickly without exceeding the predetermined voltage design limit.

10. The controller as set forth in claim 9, wherein the controller is further configured to determine the compensated kick time based on the target word line voltage.

11. The controller as set forth in claim 10, wherein the memory apparatus further includes a storage region storing a compensation time look up table having a plurality of values of the compensation time each corresponding to one of a plurality of values of the target word line voltage and wherein the controller is configured to select one of the plurality of values of the compensation time associated with the one of the plurality of values of the target word line voltage previously computed.

12. The controller as set forth in claim 9, wherein the controller is further configured to instruct the memory apparatus to increase the kicking voltage applied to each of the plurality of word lines for the compensated kick time to the predetermined voltage design limit in response to determining the target word line voltage is not greater than the predetermined voltage design limit.

13. The controller as set forth in claim 9, wherein a series of a plurality of demarcation threshold voltages demarcate between the plurality of memory states, the plurality of demarcation threshold voltages includes a primary demarcation threshold voltage associated with one of the plurality of memory states and a secondary demarcation threshold voltage associated with another of the plurality of memory states, the kick time includes a first kick time and a second time, the plurality of reference voltages includes a primary read voltage corresponding to the primary demarcation threshold voltage and a secondary read voltage corresponding to the secondary demarcation threshold voltage, the controller is further configured to:

instruct the memory apparatus to ramp the word line voltage of the selected ones of the plurality of word lines up to an initial word line voltage while applying a read pass voltage to unselected ones of the plurality of word lines in response to receiving a read command;

instruct the memory apparatus to ramp the word line voltage of the selected ones of the plurality of word lines down to the primary read voltage minus a first delta kick voltage for the first kick time;

instruct the memory apparatus to ramp the word line voltage up to the primary read voltage and sense conduction currents of the memory cells of the strings to identify the memory cells of the strings having the threshold voltage less than the primary demarcation threshold voltage;

compute the target word line voltage of the kicking voltage to be applied to the selected ones of the plurality of word lines for a second kick time as the secondary read voltage minus a second delta kick voltage during the read operation;

instruct the memory apparatus to determine whether the target word line voltage is greater than or equal to the predetermined voltage design limit;

instruct the memory apparatus to ramp the word line voltage of the selected ones of the plurality of word lines down to the secondary read voltage minus the second delta kick voltage for the second kick time in response to determining the target word line voltage is greater than or equal to the predetermined voltage design limit;

instruct the memory apparatus to extend the second kick time by the compensation time to the compensated kick time and ramp the word line voltage of the selected ones of the plurality of word lines down to the predetermined voltage design limit for the compensated kick time in response to determining the target word line voltage is not greater than the predetermined voltage design limit; and instruct the memory apparatus to ramp the word line voltage up to the secondary read voltage and sense the conduction currents of the memory cells of the strings to identify the memory cells of the strings having the threshold voltage less than the secondary demarcation threshold voltage.

14. The controller as set forth in claim 9, wherein the threshold voltage possible for each of the memory cells spans a threshold window partitioned into a plurality of regions for the plurality of memory states demarcated by a plurality of demarcation threshold voltages, the plurality of memory states includes an erased state associated with one of the plurality of regions corresponding to the threshold voltage being lower compared to others of the plurality of regions representing at least one programmed state, and one or more of the plurality of demarcation threshold voltages of the threshold window associated with the at least one programmed state are negative voltages.

15. A method of operating a memory apparatus including memory cells connected to one of a plurality of word lines and arranged in strings and configured to retain a threshold voltage corresponding to one of a plurality of memory states, the method comprising the steps of:

computing a target word line voltage including a kicking voltage to be applied to selected ones of the plurality of word lines for a kick time during a read operation;

extending the kick time by a compensation time to a compensated kick time in response to determining the target word line voltage is not greater than a predetermined voltage design limit; and applying the kicking voltage to the selected ones of the plurality of word lines for the compensated kick time thereby enabling a word line voltage of the selected ones of the plurality of word lines to reach one of a plurality of reference voltages without exceeding the predetermined voltage design limit.

16. The method as set forth in claim 15, wherein the method further includes the step of determining the compensated kick time based on the target word line voltage.

17. The method as set forth in claim 16, wherein the memory apparatus further includes a storage region storing a compensation time look up table having a plurality of values of the compensation time each corresponding to one of a plurality of values of the target word line voltage and wherein method further includes the step of selecting one of the plurality of values of the compensation time associated with the one of the plurality of values of the target word line voltage previously computed.

18. The method as set forth in claim 15, further including the step of reducing the kicking voltage applied to each of the plurality of word lines for the compensated kick time to the predetermined voltage design limit in response to determining the target word line voltage is not greater than the predetermined voltage design limit.

19. The method as set forth in claim 15, wherein a series of a plurality of demarcation threshold voltages demarcate between the plurality of memory states, the plurality of demarcation threshold voltages includes a primary demarcation threshold voltage associated with one of the plurality of memory states and a secondary demarcation threshold voltage associated with another of the plurality of memory states, the kick time includes a first kick time and a second time, the plurality of reference voltages includes a primary read voltage corresponding to the primary demarcation threshold voltage and a secondary read voltage corresponding to the secondary demarcation threshold voltage, the method further includes the steps of:

ramping the word line voltage of the selected ones of the plurality of word lines up to an initial word line voltage while applying a read pass voltage to unselected ones of the plurality of word lines in response to receiving a read command;

ramping the word line voltage of the selected ones of the plurality of word lines down to the primary read voltage minus a first delta kick voltage for the first kick time;

ramping the word line voltage up to the primary read voltage and sensing conduction currents of the memory cells of the strings to identify the memory cells of the strings having the threshold voltage less than the primary demarcation threshold voltage;

computing the target word line voltage of the kicking voltage to be applied to the selected ones of the plurality of word lines for a second kick time as the secondary read voltage minus a second delta kick voltage during the read operation;

determining whether the target word line voltage is greater than or equal to the predetermined voltage design limit;

ramping the word line voltage of the selected ones of the plurality of word lines down to the secondary read voltage minus the second delta kick voltage for the second kick time in response to determining the target word line voltage is greater than or equal to the predetermined voltage design limit;

extending the second kick time by the compensation time to the compensated kick time and ramp the word line voltage of the selected ones of the plurality of word lines down to the predetermined voltage design limit for the compensated kick time in response to determining the target word line voltage is not greater than the predetermined voltage design limit; and ramping the word line voltage up to the secondary read voltage and sensing the conduction currents of the memory cells of the strings to identify the memory cells of the strings having the threshold voltage less than the secondary demarcation threshold voltage.

20. The method as set forth in claim 15, wherein the threshold voltage possible for each of the memory cells spans a threshold window partitioned into a plurality of regions for the plurality of memory states demarcated by a plurality of demarcation threshold voltages, the plurality of memory states includes an erased state associated with one of the plurality of regions corresponding to the threshold voltage being lower compared to others of the plurality of regions representing at least one programmed state, and one or more of the plurality of demarcation threshold voltages of the threshold window associated with the at least one programmed state are negative voltages.

\* \* \* \* \*